United States Patent
Chen et al.

(10) Patent No.: US 12,484,177 B2
(45) Date of Patent: Nov. 25, 2025

(54) CIRCUIT BOARD HAVING A LOCKING STRUCTURE AND ELECTRONIC DEVICE HAVING THE CIRCUIT BOARD

(71) Applicant: Wistron Corporation, New Taipei (TW)

(72) Inventors: Gui-Ping Chen, New Taipei (TW); Yong-Qing Zhong, New Taipei (TW); Hua-Jun Liang, New Taipei (TW); Zhao-Ping Fu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 235 days.

(21) Appl. No.: 18/361,166

(22) Filed: Jul. 28, 2023

(65) Prior Publication Data

US 2024/0407125 A1  Dec. 5, 2024

(30) Foreign Application Priority Data

May 31, 2023 (CN) .......................... 202310638731.8

(51) Int. Cl.
*H05K 7/14* (2006.01)

(52) U.S. Cl.
CPC ........... *H05K 7/142* (2013.01); *H05K 7/1402* (2013.01)

(58) Field of Classification Search
CPC ............................. H05K 7/142; H05K 7/1402
USPC ........................................................ 361/759
See application file for complete search history.

(56) References Cited

U.S. PATENT DOCUMENTS

2013/0161274 A1* 6/2013 Lu .......................... G06F 1/186
                                                        211/41.17
2021/0242628 A1    8/2021 Huang

FOREIGN PATENT DOCUMENTS

CN    217689948 U    10/2022
TW       I507857 B    11/2015

OTHER PUBLICATIONS

Examination report dated Jan. 19, 2024, listed in related Taiwan patent application No. 112122770.

* cited by examiner

*Primary Examiner* — Hung S. Bui
(74) *Attorney, Agent, or Firm* — McClure, Qualey & Rodack, LLP

(57) ABSTRACT

An electronic device includes a chassis, a first circuit board, and a second circuit board. The chassis includes a bottom plate. The first circuit board includes a first connector. The second circuit board includes a board body, a second connector, and a locking assembly. The board body is configured to be slid on the bottom plate. The locking assembly includes an operating portion and a locking rod. The operating portion is connected to the board body. The locking rod is configured to be slid between a locked position and a released position along the operating portion. A locking end of the locking rod is toward to the board body. When the second connector and the first connector are connected to each other, and the locking rod is at the locked position, the locking end of the locking rod is in a locating hole of the bottom plate.

20 Claims, 17 Drawing Sheets

CIRCUIT BOARD HAVING A LOCKING STRUCTURE AND ELECTRONIC DEVICE HAVING THE CIRCUIT BOARD

CROSS-REFERENCE TO RELATED APPLICATION

This non-provisional application claims priority under 35 U.S.C. § 119(a) to Patent Application No. 202310638731.8 filed in China, P.R.C. on May 31, 2023, the entire contents of which are hereby incorporated by reference.

BACKGROUND

Technical Field

The instant disclosure relates to a circuit board having a locking structure and an electronic device having the circuit board.

Related Art

With the development of internet, the demands on server performance are increasing. The chassis of a server is to be configured to be assembled with various electronic components or modules. As for assembling a server known to the inventor, the space of the chassis is limited, and a plurality of fasten components, such as screws, are necessary for fixing the expandable components on the chassis. As a result, multiple assembling steps are needed during the assembling process, which is relatively cumbersome and also inconvenient for further maintenances. Besides, to enhance the server performance, as known to the inventor, a modularized case (a sled) for being assembled with the server is provided. In the modularized case, two circuit boards can be mated with each other through the close engagements between board to board (BTB) connectors, such that the circuit boards can perform the computation operation stably. However, such close engagement configuration of the BTB connectors results in that the plugging or unplugging of the connectors is difficult and thus it will be not easy to detach the BTB connectors from the modularized case or for repairs.

SUMMARY

In view of the foregoing issues, the instant disclosure provides a circuit board having a locking structure and an electronic device having the circuit board.

According to one or some embodiments, the electronic device comprises a chassis, a board body, and a locking assembly. The chassis comprises a bottom plate and a locating hole on the bottom plate. The locking assembly comprises an operating portion and a locking rod, wherein the operating portion is connected to the board body, and the locking rod is slidably along the operating portion between a locked position and a released position. Further, a locking end of the locking rod is in the locating hole when the locking rod is at the locked position.

Besides, according to one or some embodiments, a circuit board having a locking structure comprises a board body and a locking assembly. The locking assembly comprises an operating portion and a locking rod. The operating portion comprises a shaft, and the shaft has a first end portion and a through hole. The first end portion is connected to the board body. The locking rod is slidably along the through hole between a locked position and a released position.

In conclusion, according to any one or some embodiments, the electronic device or the circuit board thereof has the locking rod configured to be slid along the operating portion. Therefore, during the assembling process of the electronic device or the circuit board, additional locking components can be saved. Hence, the manufacturing costs of the product can be reduced and the product can be repaired conveniently.

Detailed features and advantages of the present invention are described in detail in the following implementations, and the content of the implementations is sufficient for a person skilled in the art to understand and implement the technical content of the present invention. A person skilled in the art can easily understand the objectives and advantages related to the embodiments of the present invention according to the contents disclosed in this specification, the claims, and the drawings.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

The following descriptions are provided with the aids of the drawings to describe embodiments of the present invention more clearly.

Figure 1:
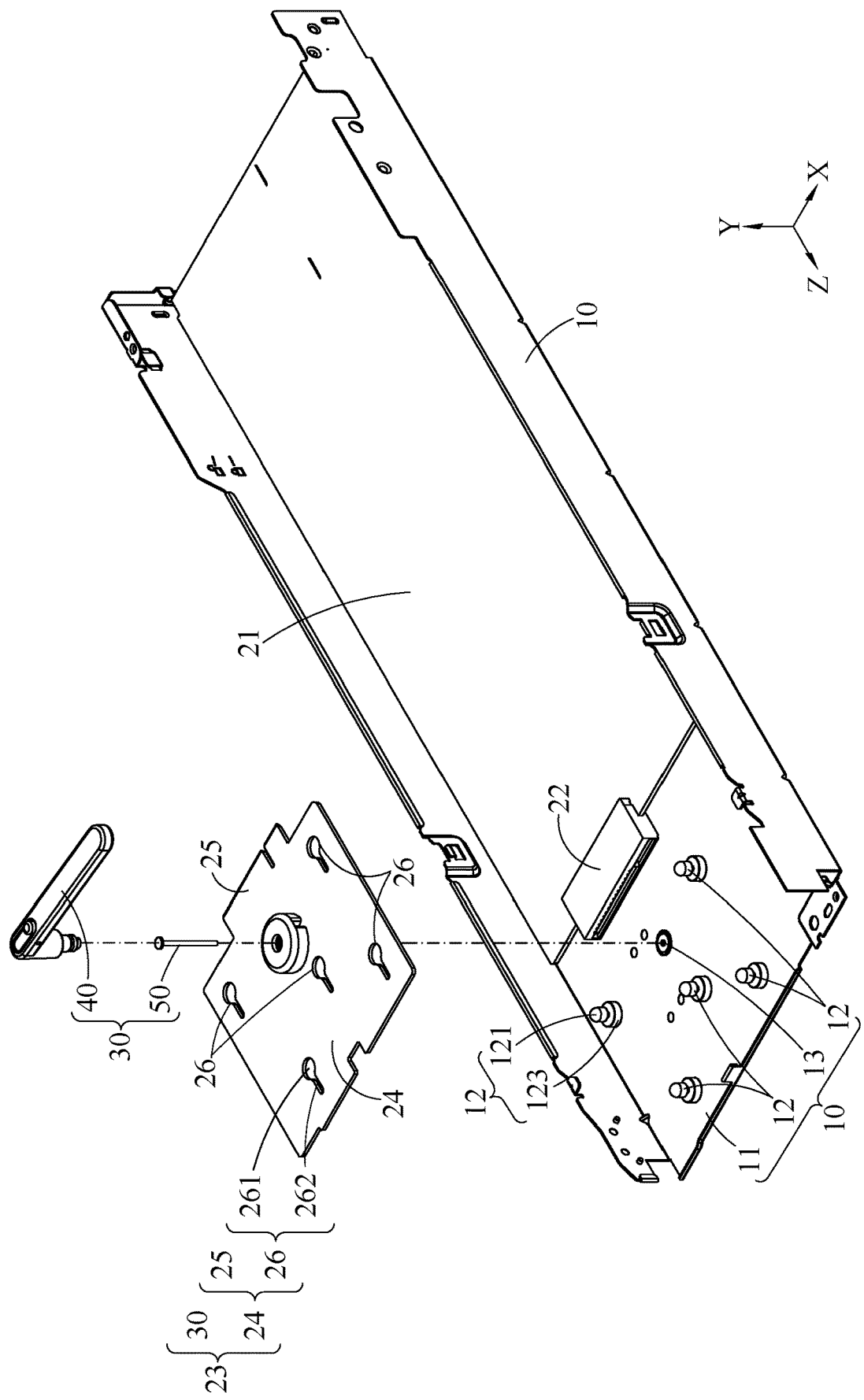
FIG. 1 illustrates an exploded view of an electronic device according to some embodiments, showing a chassis, a first circuit board, and a second circuit board.
Figure 2:
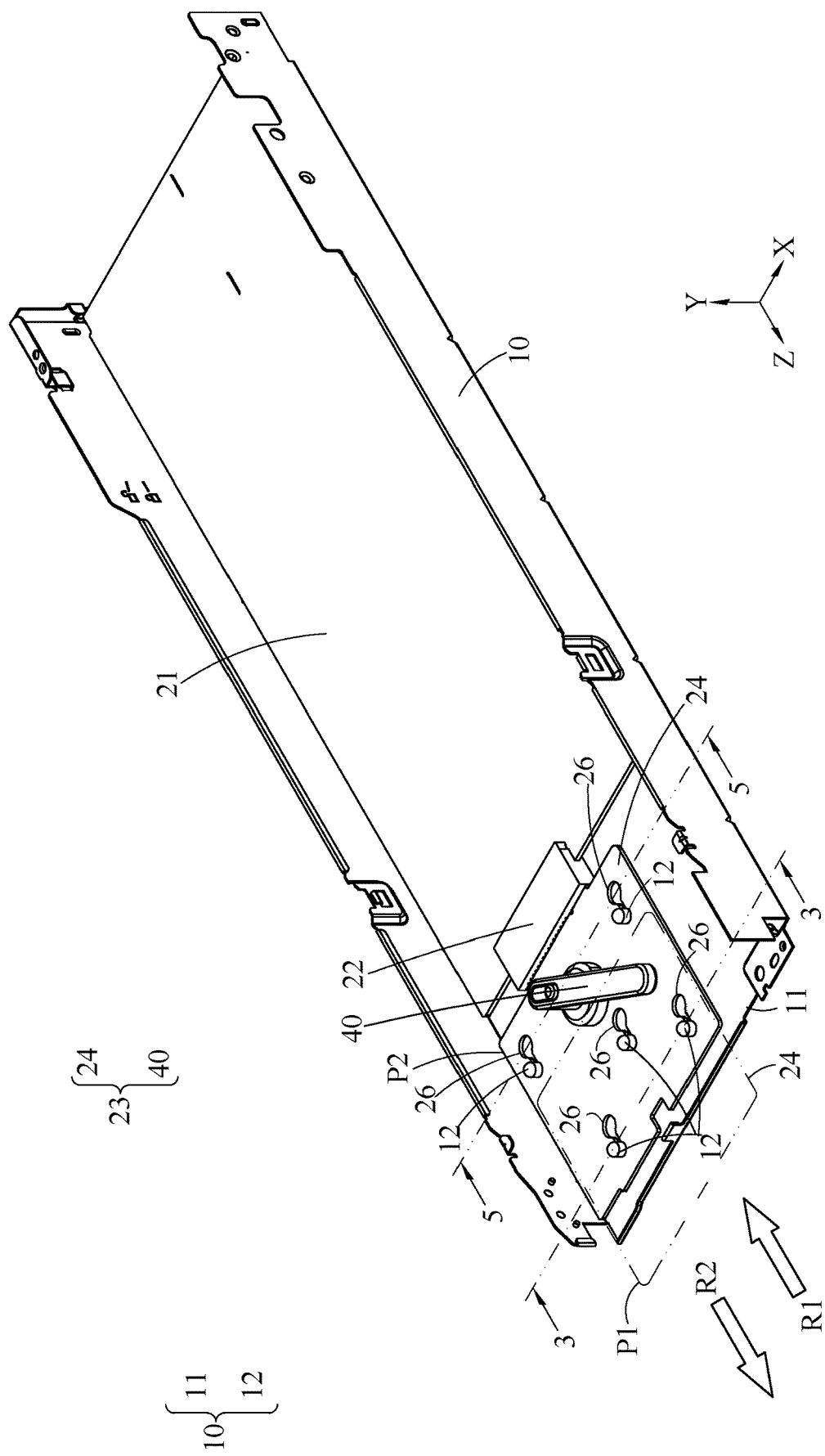
FIG. 2 illustrates a perspective view of an electronic device according to some embodiments, showing a first board position and a second board position of a board body relative to a chassis, wherein the first board position is denoted by two-dot chain lines and the second board position is denoted by solid lines.
Figure 3:
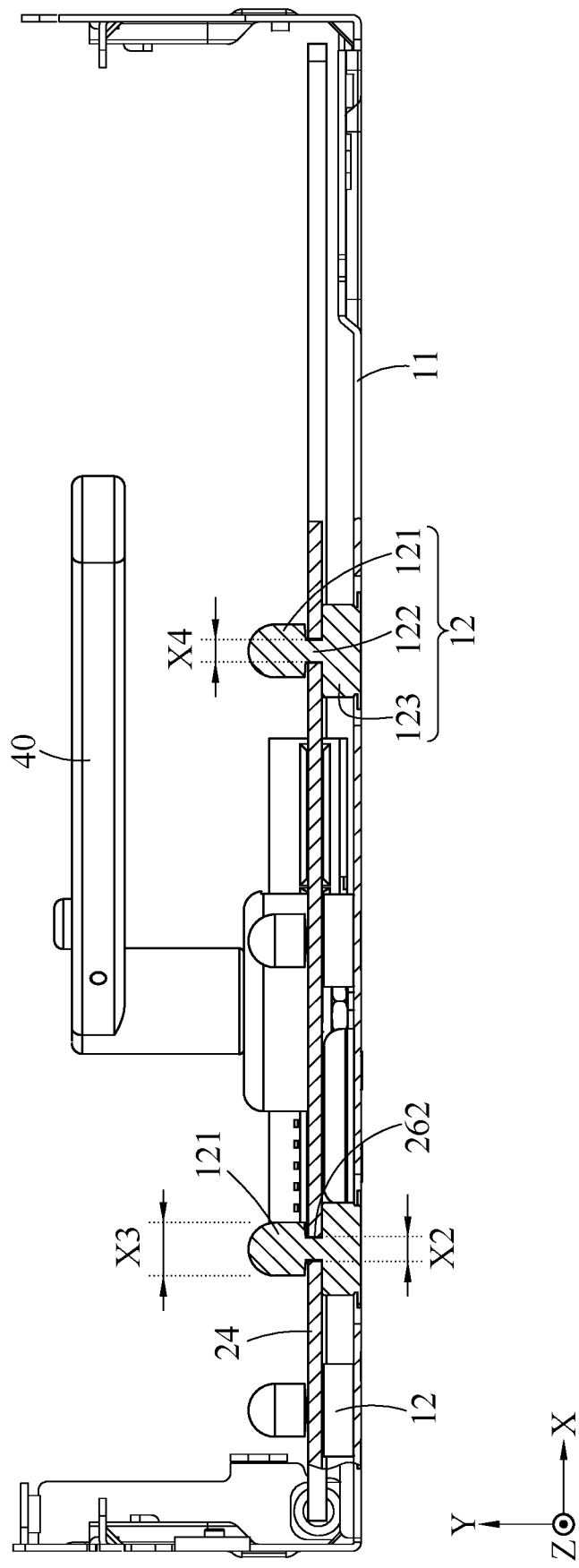
FIG. 3 illustrates a cross-sectional view along the line 3-3 shown in FIG. 2.
Figure 4:
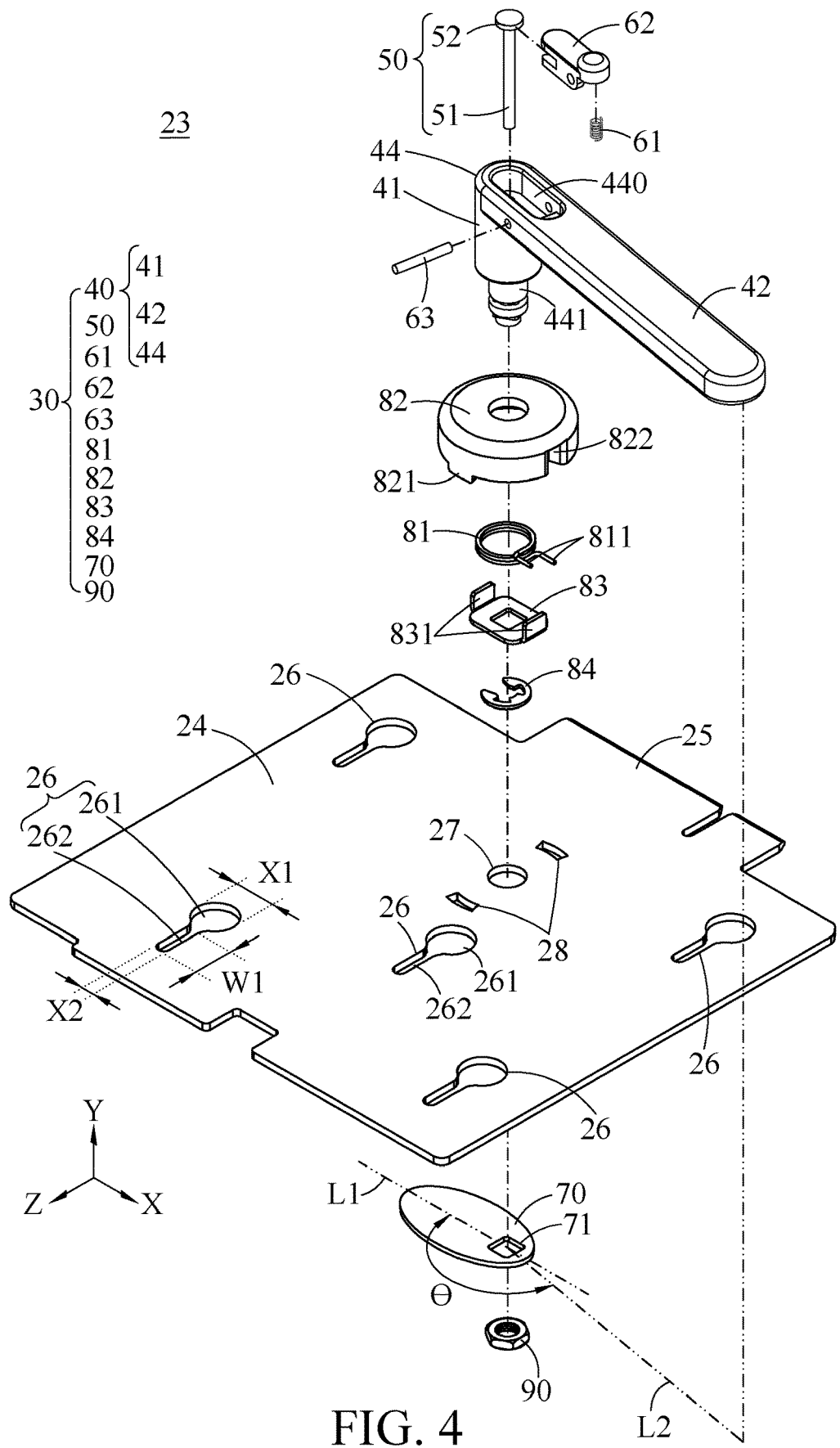
FIG. 4 illustrates an exploded view (1) of a second circuit board according to some embodiments.
Figure 5:
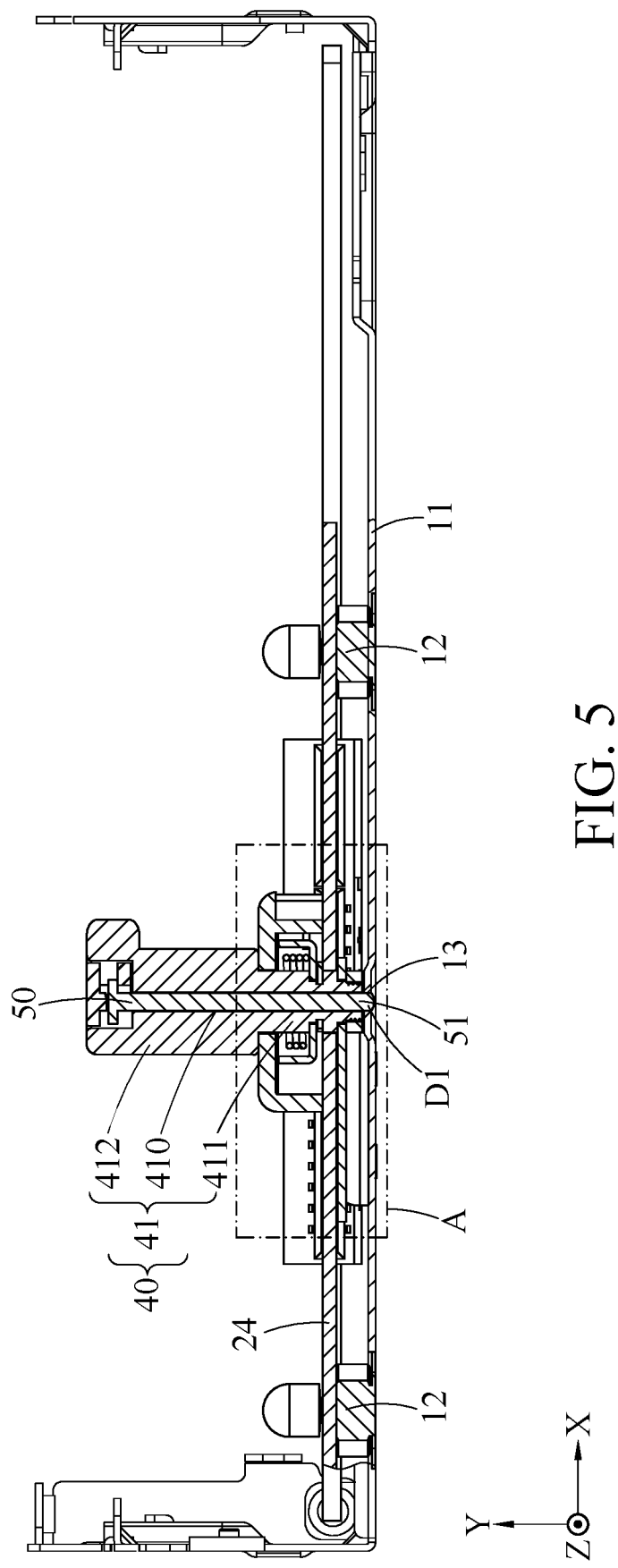
FIG. 5 illustrates a cross-sectional view along the line 5-5 shown in FIG. 2, wherein when the board body is at a second board position and the locking rod is at a locked position, a locking end of the locking rod is in a locating hole.
Figure 6:
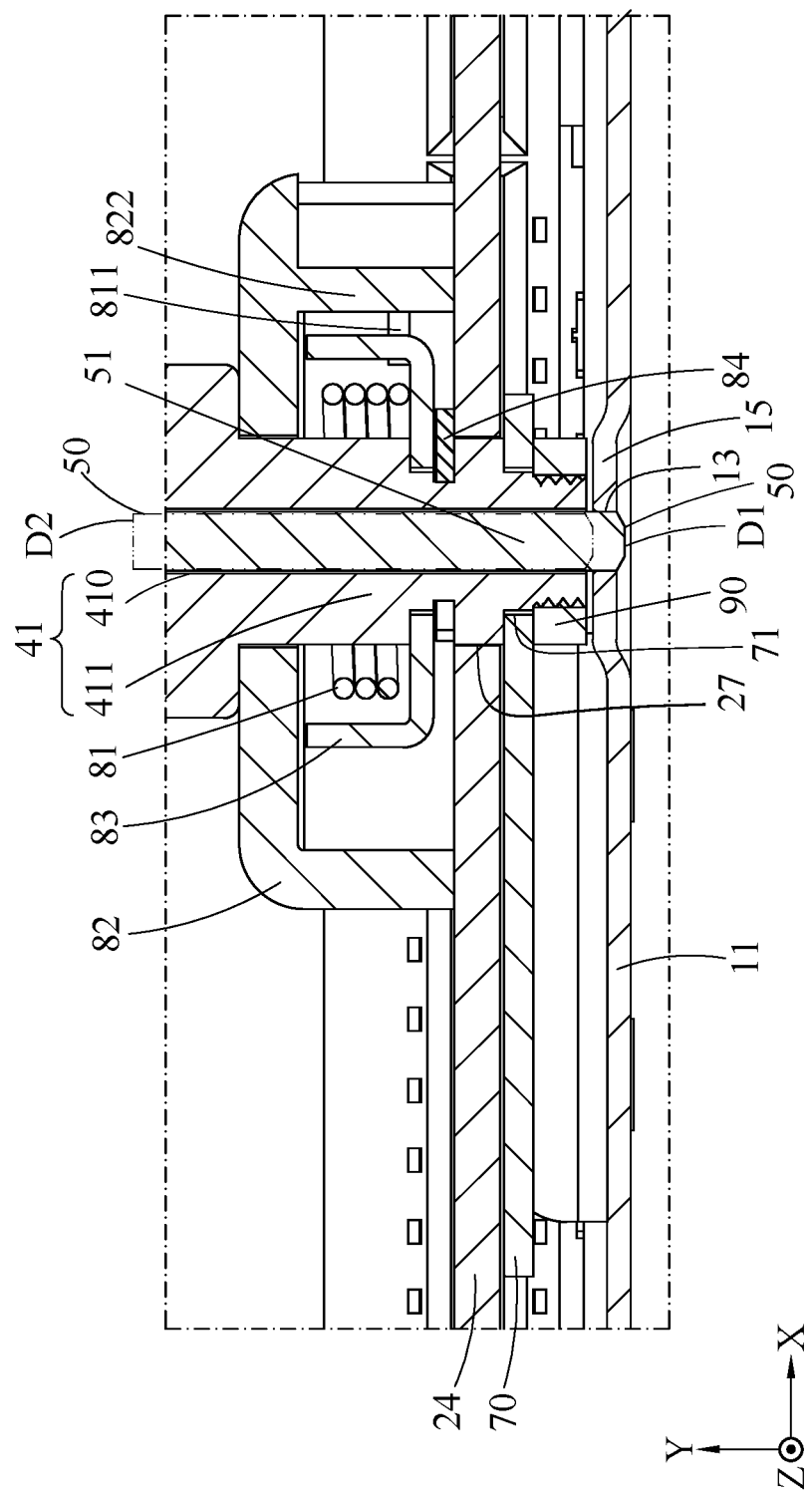
FIG. 6 illustrates an enlarged view of the region A shown in FIG. 5, showing a locked position and a released position of the locking rod relative to an operating portion, wherein the locked position is denoted by solid lines, and the released position is denoted by two-dot chain lines.

Please refer to FIG. 1, FIG. 2, FIG. 3, FIG. 4, FIG. 5, and FIG. 6. FIG. 1 illustrates an exploded view of an electronic device according to some embodiments, showing a chassis, a first circuit board, and a second circuit board. FIG. 2 illustrates a perspective view of an electronic device according to some embodiments, showing a first board position and a second board position of a board body relative to a chassis, wherein the first board position is denoted by two-dot chain lines, and the second board position is denoted by solid lines. FIG. 3 illustrates a cross-sectional view along the line 3-3 shown in FIG. 2. FIG. 4 illustrates an exploded view of a second circuit board according to some embodiments. FIG. 5 illustrates a cross-sectional view along the line 5-5 shown in FIG. 2, wherein when the board body is at a second board position and the locking rod is at a locked position, a locking end of the locking rod is in a locating hole. FIG. 6 illustrates an enlarged view of the region A shown in FIG. 5, showing a locked position and a released position of the locking rod relative to an operating portion, wherein the locked position is denoted by solid lines, and the released position is denoted by two-dot chain lines.

Please refer to FIG. 1, FIG. 5, and FIG. 6. In FIG. 1, an electronic device comprises a chassis 10, a board body 24, and a locking assembly 30. The chassis 10 comprises a bottom plate 11 and a locating hole 13 on the bottom plate 11. The locking assembly 30 comprises an operating portion 40 and a locking rod 50. The operating portion 40 is connected to the board body 24. In FIG. 5, the locking rod 50 is configured to be slid along the operating portion 40. In FIG. 6, the locking rod 50 is slid between a locked position D1 and a released position D2 relative to the operating portion 40. A locking end 51 of the locking rod 50 is toward the board body 24. When the locking rod 50 is at the locked position D1, the locking end 51 of the locking rod 50 is in the locating hole 13.

Please refer to FIG. 1, FIG. 5, and FIG. 6. In some embodiments, an electronic device comprises a chassis 10 and a circuit board having a locking structure, as shown in FIG. 1. The circuit board having the locking structure comprises a board body 24 and a locking assembly 30. The locking assembly 30 comprises an operating portion 40 and a locking rod 50. In FIG. 5, the operating portion 40 comprises a shaft 41. The shaft 41 has a first end portion 411 and a through hole 410 (the through hole 410 is where the locking rod 50 in the shaft 41 is located). The first end portion 411 of the shaft 41 is connected to the board body 24. In FIG. 6, the locking rod 50 is configured to be slid between a locked position D1 and a released position D2 along the through hole 410 of the shaft 41. A locking end 51 of the locking rod 50 is toward the board body 24.

Therefore, according to one or some embodiments of the instant disclosure, the locking rod 50 is configured to be slid along the operating portion 40, so that the board body 24 can be locked at the locating hole 13 of the bottom plate 11 through the locking rod 50. Thus, additional locking components can be saved while the board body 24 can still be assembled on the bottom plate 11 conveniently.

Please refer to FIG. 1 and FIG. 2. In some embodiments, the electronic device comprises a chassis 10, a first circuit board 21, and a second circuit board 23. The electronic device may be, but not limited to, a server, a rack typed server, or a blade typed server. The chassis 10 may be, but not limited to, a 1U modularized chassis (1U sled) or a chassis adapted to accommodate the first circuit board 21 and the second circuit board 23.

Please refer to FIG. 1. In some embodiments, the chassis 10 comprises a bottom plate 11, a guiding portion 12, and a locating hole 13. The guiding portion 12 and the locating hole 13 are on the bottom plate 11. The number of the guiding portion 12 may be plural or one, and the position of the guiding portion 12 on the bottom plate 11 is not limited.

The first circuit board 21 is fixed on the bottom plate 11 and comprises a first connector 22.

The second circuit board 23 comprises a board body 24 and a locking assembly 30, wherein the board body 24 comprises a matching portion 26 and a second connector 25.

In some embodiments, the chassis 10 may be a 1U modularized chassis (1U sled). The first circuit board 21 may be a main board. The second circuit board 23 may be a probe interface board. The first connector 22 may be a board to board (BTB) connector. The second connector 25 may be a connection port corresponding to the first connector 22. The first circuit board 21 and the second circuit board 23 are electronically connected to each other through the connection of the first connector 22 and the second connector 25.

Please refer to FIG. 2 The matching portion 26 is configured to be slid along the guiding portion 12 of the bottom plate 11, so that the board body 24 is slidable between a first board position P1 and a second board position P2. When the board body 24 is at the second board position P2, the second connector 25 is connected to the first connector 22. The number of the matching portion 26 may be plural or one, and the number and the position of the matching portion 26 correspond to the number and the position of the guiding 12 of the bottom plate 11. In other words, in this embodiment, one guiding portion 12 corresponds to one matching portion 26. In some embodiments, the guiding portion 12 may be a plurality of short columns (like T-pins). Each of the guiding portions 12 is configured to movably pass through a corresponding one of the matching portion 26. This is, in this embodiment, the board body 24 can be detached from the chassis 10, and the matching portion 26 is served as a rail for the movement of the guiding portion 12. Therefore, a certain movement path is provided for the board body 24 to be slid between the first board position P1 and the second board position P2.

The detail structures of the guiding portion 12 and the matching portion 26 are shown in FIG. 3 and FIG. 4.

Please refer to FIG. 3, in some embodiments, the guiding portion 12 comprises a head 121, a neck 122, and a base 123. The neck 122 is a joint portion between the head 121 and the neck 123, and the base 123 is fixed on the bottom plate 11. Please refer to FIG. 4. The matching portion 26 comprises a rail section 262 and an insertion section 261. The rail section 262 and the insertion section 261 are in communication with each other to form a drop-shaped opening. In FIG. 3, the guiding portion 12 is at the rail section 262 of the matching portion 26. In the X axis of FIG. 3, a width X3 of the head 121 of the guiding portion 12 is substantially greater than a width X4 of the neck 122, the width X3 of the head 121 is also substantially greater than a width X2 of the rail section 262, and the width X4 of the neck 122 is substantially equal to or less than the width X2 of the rail section 262. Therefore, during the sliding movement of the guiding portion 12 along the rail section 262, the guiding portion 12 does not detach from the rail section 262 easily. In the X axis of FIG. 4, a width X1 of the insertion section 261 is substantially greater than the width X2 of the rail section 262. In the Z axis of FIG. 4, a length W1 of the rail section 262 is sufficient for the board body 24 to be slid to the second board position P2 along an inserting direction R1 shown in FIG. 2, so that the electronic connection between the second circuit board 23 and the first circuit board 21 can be achieved. Moreover, referring to FIG. 1, in some embodiments, an opening size of the insertion portion 261 is sufficient to accommodate a size of the head 121 of the guiding portion 12. Therefore, during the assembling process, the operator can insert the head 121 of the guiding portion 12 into the opening of the insertion section 261, and then slide the guiding portion 12 toward the rail section 262, so that the board body 24 will be properly assembled on the bottom plate 11.

Besides, referring to FIG. 2, in some embodiments, the second board position P2 is a position where the second circuit board 23 is electronically connected to the first circuit board 21. The first board position P1 is a position where the second circuit board 23 is disconnected to the first circuit board 21. When the operator would like to assemble the second circuit board 23 with the first connector 22 of the chassis 10, the board body 24 is forced to be slid from the first board position P1 toward the first connector 22 of the first circuit board 21, wherein the sliding direction of the board body 24 is the inserting direction R1 in FIG. 2 (a direction from the first board position P1 toward the second board position P2). When the operator would like to detach the second circuit board 23 from the chassis 10, the board body 24 is pushed away from the first connector 22, wherein the sliding direction of the board body 24 is a detaching direction R2 in FIG. 2 (a direction from the second board position P2 toward the first board position P1).

Please refer to FIG. 4, FIG. 5, and FIG. 6. The locking assembly 30 comprises the operating portion 40 and the locking rod 50. The operating portion 40 is connected to the board body 24. The operating portion 40 may be a handlebar adapted for the assembling or disassembling of the second circuit board 23. For example, in FIG. 4, the operating portion 40 is pivotally connected to a hole (pivot hole 27) on the board body 24.

In FIG. 5, the locking rod 50 is in the operating portion 40 (details are described later), and the locking rod 50 is slidable relative to the operating portion 40 along the X axis of FIG. 5. In FIG. 6, the locking rod 50 is configured to be slid between the locked position D1 and the released position D2 along the shaft 41. The locking end 51 of the locking rod 50 is toward the board body 24.

In FIG. 5, the locking end 51 of the locking rod 50 is toward the board body 24. When the board body 24 is at the second board position P2 and the locking rod 50 is at the locked position D1, the locking end 51 of the locking rod 50 is in the locating hole 13. In FIG. 6, the locking end 51 of the locking rod 50 is movably inserted in the locating hole 13. When the locking rod 50 is at the locked position D1, the locking end 51 is in the locating hole 13. When the locking rod 50 is at the released position D2, the locking end 51 is detached from the locating hole 13 or retracted back to the shaft 41. The sliding movement of the locking rod 50 relative to the operating portion 40 may be driven by the operation of the operator manually, by a gravity of the locking rod 50 in the −Y axis direction, or by an elastic force applied on the other end of the locking rod 50 opposite to the locking end 51 (details are described later).

Therefore, as to the electronic device having the second circuit board 23, the second circuit board 23 can be slidable along the bottom plate 11 in the inserting direction R1 or in the detaching direction R2 of FIG. 2, and the second circuit board 23 is a detachable component of the electronic device. Thus, the electronic device with the convenience of maintenance and the expandability of system can be provided. In addition, through the configuration that the locking rod 50 of the locking assembly 30 is slidable along the operation portion 40, when the second circuit board 23 and the first circuit board 21 are connected to each other, the locking end 51 of the locking rod 50 is in the locating hole 13 of the chassis 10. Therefore, the second circuit board 23 can be locked at the locating hole 13. Accordingly, the stable connection between the first circuit board 21 and the second circuit board 23 can be provided, and additional locking components can be saved. Hence, the manufacturing cost of the electronic device can be reduced, which is cost-effective.

Figure 7:
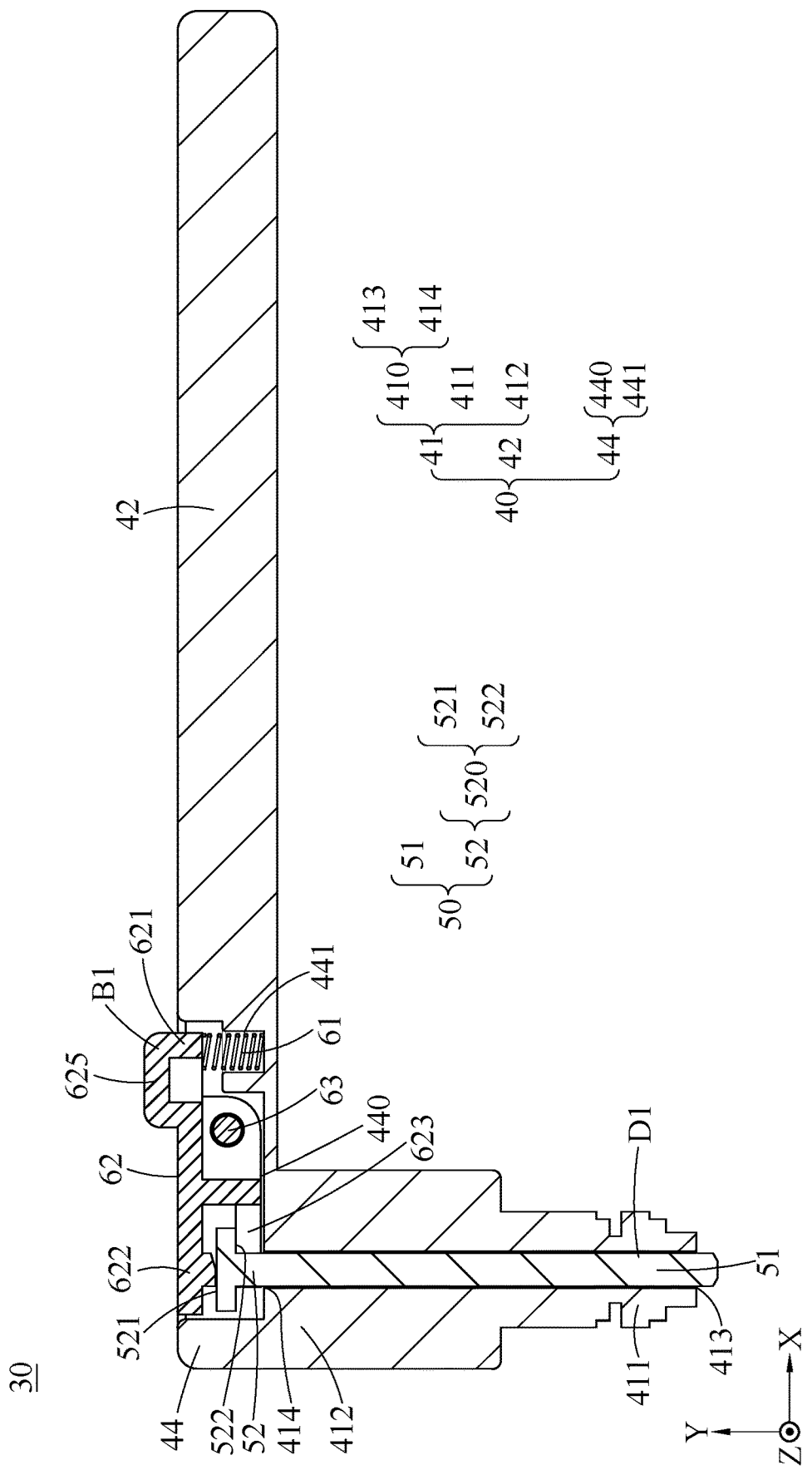
FIG. 7 illustrates a partial cross-sectional view (1) of a locking assembly according to some embodiments, showing an operating portion, a locking rod, an elastic element, a pin, and a pressing element, wherein the pressing element is at a first button position.
Figure 8:
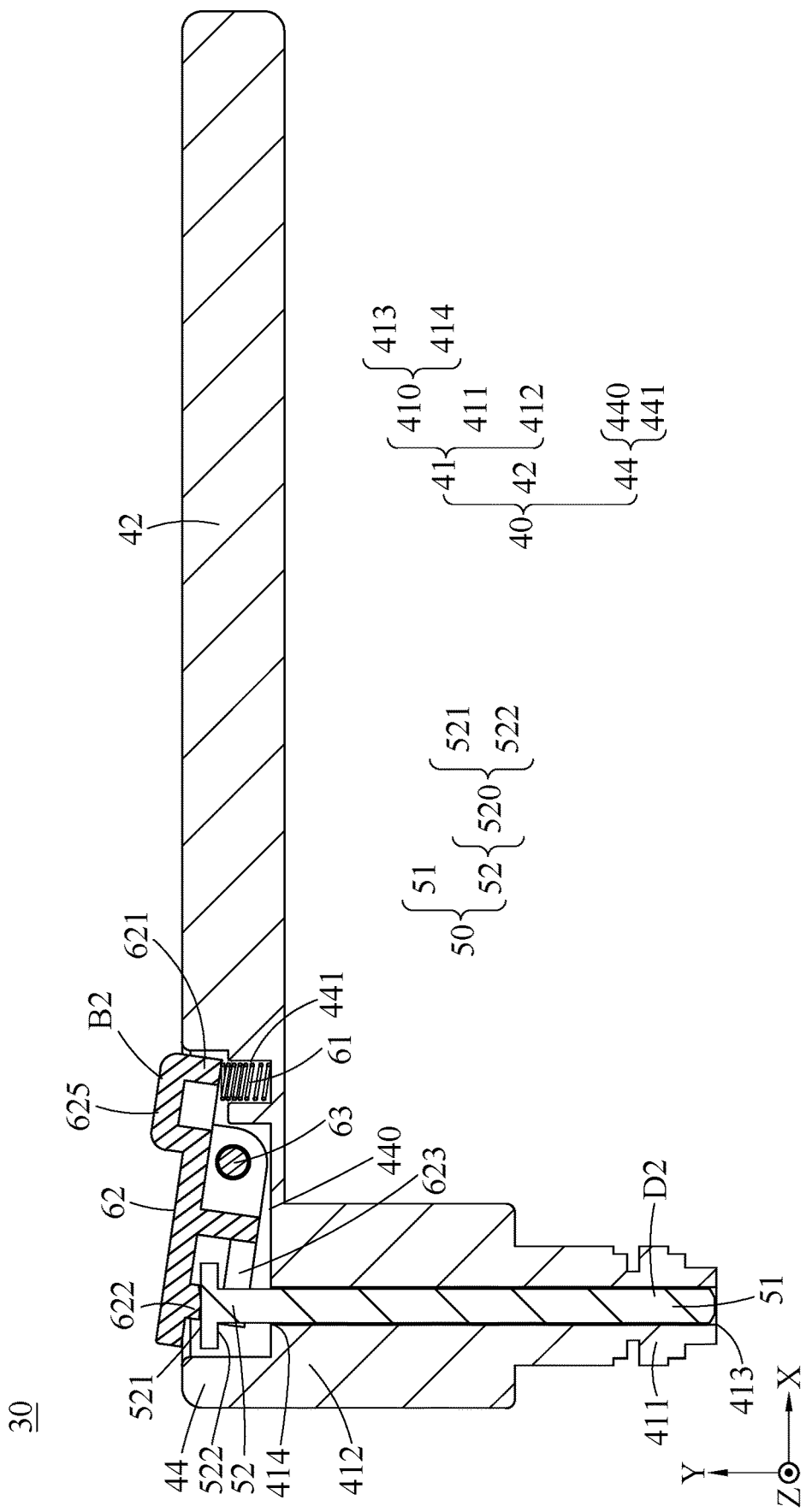
FIG. 8 illustrates a partial cross-sectional view (2) of a locking assembly according to some embodiments, showing an operating portion, a locking rod, an elastic element, a pin, and a pressing element, wherein the pressing element is at a second button position.

Furthermore, please refer to FIG. 4, FIG. 5, FIG. 6, FIG. 7, and FIG. 8. FIG. 7 illustrates a partial cross-sectional view of a locking assembly according to some embodiments, showing an operating portion, a locking rod, an elastic element, a pin and a pressing element, wherein the pressing element is at a first button position. FIG. 8 illustrates a partial cross-sectional view of a locking assembly according to some embodiments, showing an operating portion, a locking rod, an elastic element, a pin and a pressing element, wherein the pressing element is at a second button position.

Please refer to FIG. 4. In some embodiments, the circuit board having the locking structure comprises the board body 24 and the locking assembly 30. The locking assembly 30 comprises the operating portion 40 and the locking rod 50. The operating portion 40 comprises a shaft 41 and a handle 42. Specifically, in this embodiment, referring to FIG. 7, the shaft 41 has a first end portion 411, a second end portion 412, and a through hole 410. The first end portion 411 is connected to the board body 24 (shown in FIG. 4), and the second end portion 412 is connected to the handle 42. Two openings of the through hole 410 of the shaft 41 (such as the first opening 413 and the second opening 414 shown in FIG. 7) are at the first end portion 411 and the second end portion 412, respectively.

Please refer to FIG. 4, FIG. 5, FIG. 7, and FIG. 8. In some embodiments, in FIG. 4, the shaft 41 is a portion where the operating portion 40 is substantially perpendicular to the board body 24, and the handle 42 is a portion where the operating portion 40 is substantially parallel to the board body 24. One of two ends of the locking rod 50 toward the board body 24 is the locking end 51, and the other end of the locking rod 50 is an abutting end 52. The locking end 51 and the abutting end 52 are at the opposite ends of the locking rod 50. In FIG. 5, one of two ends of the shaft 41 where the shaft 41 is connected to the board body 24 is the first end portion 411, and the other end of the shaft 41 opposite to the first end portion 411 is the second end portion 412. In FIG. 7, the second end portion 412 is connected to the handle 42 through the connection portion 44. The first end portion 411 is provided with a first opening 413. The second end portion 412 is provided with a second opening 414. The first opening 413 and the second opening 414 are in communication with each other to form the through hole 410. The locking rod 50 is in the through hole 410. The locking rod 50 is slidable relative to the operating portion 40 along the Y axis of FIG. 7. In FIG. 7, when the locking rod 50 is at the locked position D1, the end surface of the locking end 51 protrudes out of the first opening 413 of the shaft 41. In FIG. 8, when the locking rod 50 is at the released position D2, the locking end 51 is detached from the locating hole 13 (shown in FIG. 6). The locking end 51 is in the shaft 41, and the end surface of the locking end 51 is flush with the first opening 413.

Therefore, according to some embodiments, through the configuration that the operating portion 40 of the locking assembly 30 is connected to the board body 24, the operator can apply an operating force on the operating portion 40. Besides, through the configuration that the locking rod 50 is slidable along the operating portion 40, the board body 24 can be locked at a certain location (for example, the locating hole 13) through the locking rod 50. Therefore, the electronic device with the convenience of assembling can be provided.

In some embodiments, when the locking rod 50 is at the released position D2, the locking end 51 does not protrude out of the first opening 413. The end surface of the locking end 51 is flush with the first opening 413 or inside the through hole 410.

Figure 9:
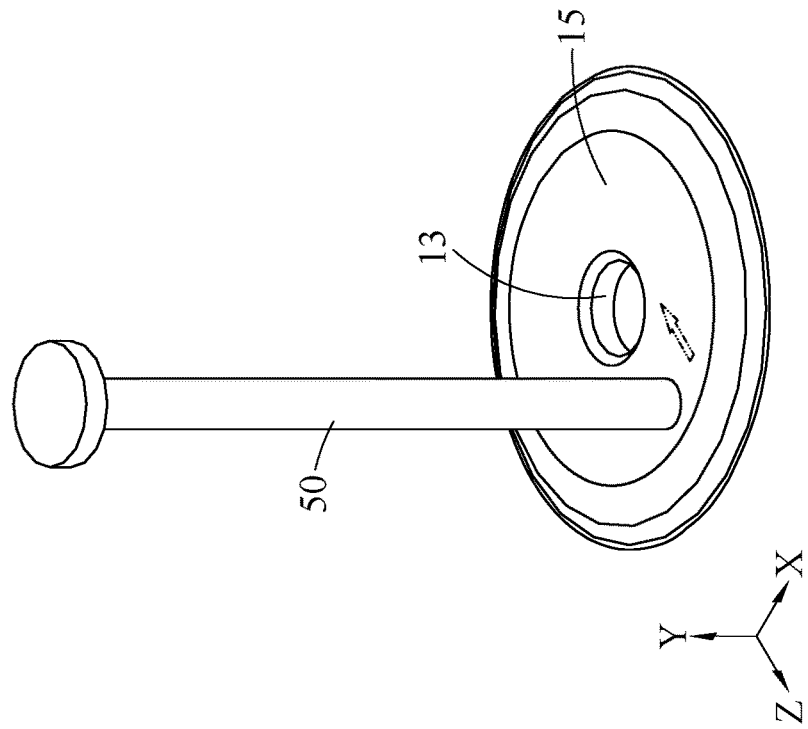
FIG. 9 illustrates a schematic view of a locking rod and a locating hole according to some embodiments, showing a position of a slope portion relative to the locating hole, wherein a movement direction of the locking rod toward the locating hole when an operating portion is operated is denoted by a dotted arrow.

Please refer to FIG. 6 and FIG. 9. FIG. 9 illustrates a schematic view of a locking rod and a locating hole according to some embodiments, showing a position of a slope portion relative to the locating hole, wherein a movement direction of the locking rod toward the locating hole when an operating portion is operated is denoted by a dotted arrow.

Referring to FIG. 6, in some embodiments, the bottom plate 11 has a slope portion 15, and the slope portion 15 is configured on one side of the locating hole 13. In some embodiments, the slope portion 15 may be a protrusion or a recess on the bottom plate 11 and is adapted to guide the locking end 51 toward the locating hole 13. In some embodiments, the slope portion 15 may be in the sliding path between the first board position P1 and the second board position P2. In some embodiments, the slope portion 15 may be outside of the locating hole 13, and the slope portion 15 may be around the surface of the locating hole 13 partially or entirely.

In FIG. 6, in some embodiments, the slope portion 15 is the protrusion on the bottom plate 11, and the locating hole 13 is at a center portion of the protrusion. Further, in FIG. 9, the slope portion 15 is around the surface of the locating hole 13 entirely. The dotted arrow of FIG. 9 shows a movement direction of the locking rod 50 toward the locating hole 13 when the operating portion 40 is operated. In some embodiments, the dotted arrow of FIG. 9 may be the inserting direction R1 of FIG. 2. In some embodiments, when the board body 24 is slid on the bottom plate 11, the end surface of the locking end 51 abuts against the bottom plate 11. When the locking rod 50 is slid to reach the slope portion 15, the sliding speed of the locking rod 50 is affected by the slope change of the surface abutting the locking end 51.

Besides, referring to FIG. 4 and FIG. 7, in some embodiments, the locking assembly 30 further comprises an elastic element 61. In a normal condition, the elastic element 61 is adapted to provide a force on the locking rod 50 to push the locking rod 50 toward the locked position D1 (shown in FIG. 7). The elastic element 61 may be a compression spring, a tension spring, a spring leaf, or a component with the ability of storing deformation energy. The elastic element 61 provides the force directly or indirectly for the locking end 50 in order to maintain the locking rod 50 at the locked position D1 or to push the locking end 51 of the locking rod 50 toward the locating hole 13.

Referring FIG. 7 and FIG. 8, in some embodiments, in FIG. 7, the locking rod 50 in a normal condition is slid in the −Y axis direction by the force provided by the elastic element 61. The sliding direction of the locking rod 50 is from the released position D2 of FIG. 8 toward the locked position D1 of FIG. 7. In other words, in this embodiment, the force is applied to push the locking end 51 of the locking rod 50 toward the locating hole 13 (shown in FIG. 6). Therefore, when the board body 24 is slid to the second board position P2, the elastic element 61 is able to push the locking rod 50 toward the locked position D1, and the locking rod 50 can automatically (without applying any force from the operator) lock the board body 24 at a certain location.

In some embodiments, the elastic element 61 may directly abut against (without intermediates) the locking rod 50 to provide the force. In some embodiments, the elastic element 61 may abut against an intermediate and provide the force applied on the locking rod 50 through the intermediate. For example, in FIG. 7, the intermediate is a pressing element 62. The elastic element 61 abuts against one of two ends of the pressing element 62. The other end of the pressing element 62 abuts against the locking rod 50, so that the force can push the locking rod 50 toward the locked position D1.

Specifically, referring to FIG. 7 and FIG. 8, in some embodiments, the locking assembly 30 further comprises the pressing element 62. The pressing element 62 is pivotally connected to the operating portion 40 and comprises a first arm 621 and a second arm 622. In some embodiments, the pressing element 62 is pivotally connected to the connection portion 44 of the operating portion 40 through a pin 63. In the normal condition, the elastic element 61 abuts against the first arm 621 of the pressing element 62 in the +Y axis direction, so that the second arm 622 abuts against the abutting end 52 of the locking rod 50 in the −Y axis direction. Accordingly, in the normal condition, the elastic element 61 is able to provide the force to push the locking rod 50 toward the locked position D1 (shown in FIG. 7). Therefore, when the locking end 51 of the locking rod 50 is in the locating hole 13, the locking rod 50 in the normal condition can be maintained at the locked position D1 by the force of the elastic element 61, so that the board body 24 is not detached from the chassis 10 easily.

In some embodiments, referring in FIG. 7, the connection portion 44 has an accommodation portion 440 and a placement groove 441. The accommodation portion 440 is a concave groove of the connection portion 44 adapted to accommodate the pressing element 62. The placement groove 441 is adapted to accommodate the elastic element 61. The pressing element 62 is pivotally connected to two opposite side walls of the accommodation portion 440 by a pin 63 (shown in FIG. 4). Therefore, the first arm 621 and the second arm 622 of the pressing element 62 is adapted to work as a lever, wherein the pin 63 is served as the fulcrum of the lever. Besides, because the pressing element 62 is in the accommodation portion 440, the pressing element 62 will be not entirely exposed out of the handle 42. Moreover, in the embodiment shown in FIG. 7, only the first arm 621 of the pressing element 62 has a pressing convex 625 protruding from the upper surface of the handle 42, so that the pressing convex 625 is configured to be easily pressed by the user.

Figure 10:
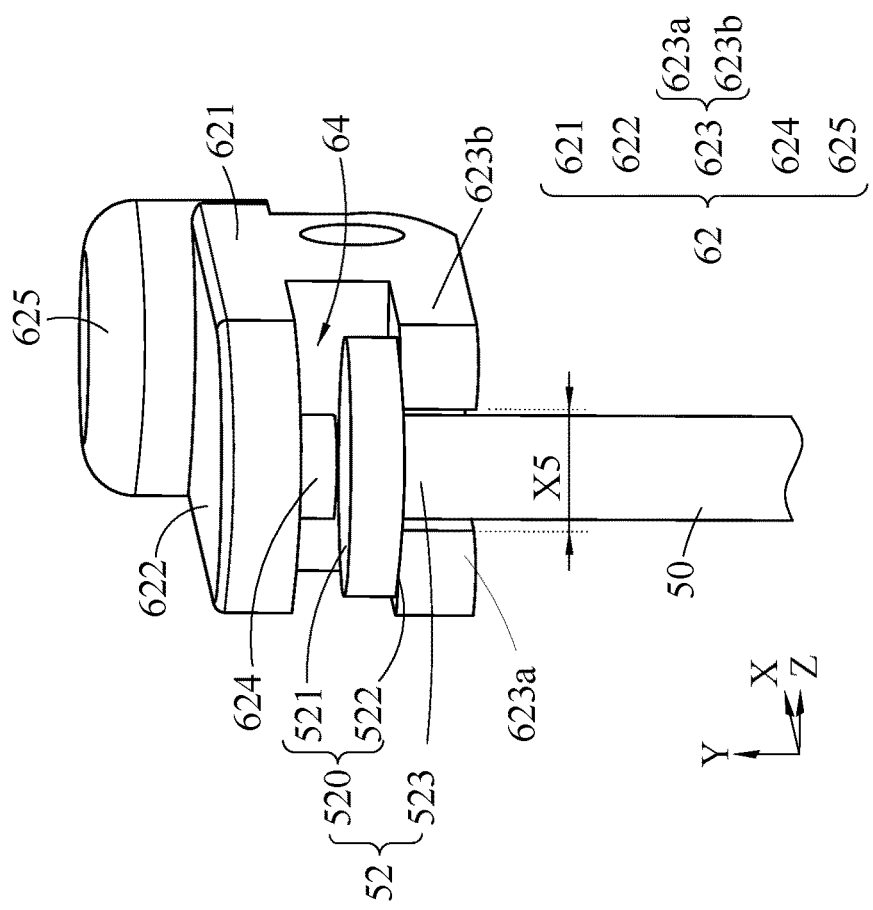
FIG. 10 illustrates a partial perspective view of a locking rod and a pressing element according to some embodiments, showing the positional relationship between the pressing element and an abutting end of the locking rod when the components are assembled.

Further, please refer to FIG. 7, FIG. 8, and FIG. 10. FIG. 10 illustrates a partial perspective view of a locking rod and a pressing element according to some embodiments, showing the positional relationship between the pressing element and an abutting end of the locking rod when the components are assembled. Please refer to FIG. 7. In some embodiments, the pressing element 62 further comprises a docking portion 623. The abutting end 52 of the locking rod 50 is between the docking portion 623 and the second arm 622 of the pressing element 62, and in the normal condition, the abutting end 52 of the locking rod 50 substantially contacts the docking portion 623.

In FIG. 10, in some embodiments, the abutting end 52 of the locking rod 50 is at a space 64 formed by the docking portion 623 and the second arm 622. The abutting end 52 has a flat portion 520 and a rod portion 523. The flat portion 520 has two end surfaces 521 and 522. The space 64 is greater than the thickness of the flat portion 520 (the thickness is a distance between the end surface 521 and the end surface 522 in the Y axis of FIG. 10). In some embodiments, the pressing element 62 has an abutting convex 624 and two docking portions 623a and 623b, and the abutting convex 624 protrudes toward the abutting end 52. The end surface of the abutting convex 624 may be curved or beveled. The two docking portions 623a and 623b are connected to each other to form a fork-shaped structure, and two free ends of the docking portions 623a and 623b are opposite to each other to form a notch, wherein the rod portion 523 is a portion of the abutting end 52 in the notch. In the Z axis of FIG. 10, a width X5 of the notch is substantially less than an outer diameter of the flat portion 520 but greater than or equal to a diameter of the rod portion 523 (the diameter of the rod portion 523 is a diameter of a cross-sectional area of the rod portion 523 in the X-Z plane). During the assembling process, the rod portion 523 is inserted into the notch defined by the two docking portions 623a and 623b (that is, in this embodiment, the abutting end 52 enters the space 64 in the +X axis direction of FIG. 10). The end surface 521 of the flat portion 520 contacts the abutting convex 624 of the second arm 622. Alternatively, in some embodiments, a gap is between the end surface 521 and the abutting convex 624, and the size of the gap is configured that the gap does not interfere the swinging movement of pressing element 62 between a first button position B1 (shown in FIG. 7) and a second button position B2 (shown in FIG. 8). In some embodiments, in FIG. 7, in the normal condition, the end surface 522 opposite to the end surface 521 contacts the docking portion 623.

In FIG. 8, when the operator presses the pressing convex 625 of the pressing element 62 and applies a pressing force on the first arm 621, the pressing force is greater than the force provided by the elastic element 61 in the normal condition, so that the pressing element 62 is swung to the second button position B2. Meanwhile, the docking portion 623 abuts against the end surface 522, and the end surface 521 abuts against the second arm 622. Accordingly, the locking end 52 is retracted back to the shaft 41, and the locking rod 50 is at the released position D2. On the other hand, when the end surface of the locking end 51 of the locking rod 50 abuts against the bottom plate 11, because the locking rod 50 is abutted against by the bottom plate 11, the locking rod 50 is at the released position D2. As a result, the abutting end 52 abuts against the second arm 622, and the pressing element 62 is at the second button position B2.

Therefore, in some embodiments, the operator is able to detach the locking rod 50 from the locked position D1 by pressing the pressing convex 625 of the pressing element 62, so that the disassembling of the circuit board can be achieved conveniently. Besides, when the locking end 51 of the locking rod 50 is at a position corresponding to the locating hole 13, and the operator releases the first arm 621 of the pressing element 62, the elastic element 61 will abut against the first arm 621, and the second arm 622 will abut against the flat portion 520 of the abutting end 52 so to push the locking end 51 of the locking rod 50 into the locating hole 13.

In some embodiments, referring to FIG. 4 and FIG. 6, the board body 24 has a pivot hole 27, and the first end portion 411 of the shaft 41 of the operating portion 40 is pivotally connected to the pivot hole 27. As shown in FIG. 4 and FIG. 6, the locking assembly 30 further comprises a fixed element 84 and a fasten element 90. The fixed element 84 is engaged with the first end portion 411 of the shaft 41. The fixed element 84 may be, but not limited to, a C-shaped snap ring. The first end portion 411 of the shaft 41 passes through the pivot hole 27 of the board body 24 and is fixed by the fasten element 90. Therefore, the shaft 41 is pivotally connected to the board body 24 through the fixed element 84 and the fasten element 90, so that the shaft 41 is rotatable relative to the board body 24 by taking the Y axis as the rotational axis.

Figure 11:
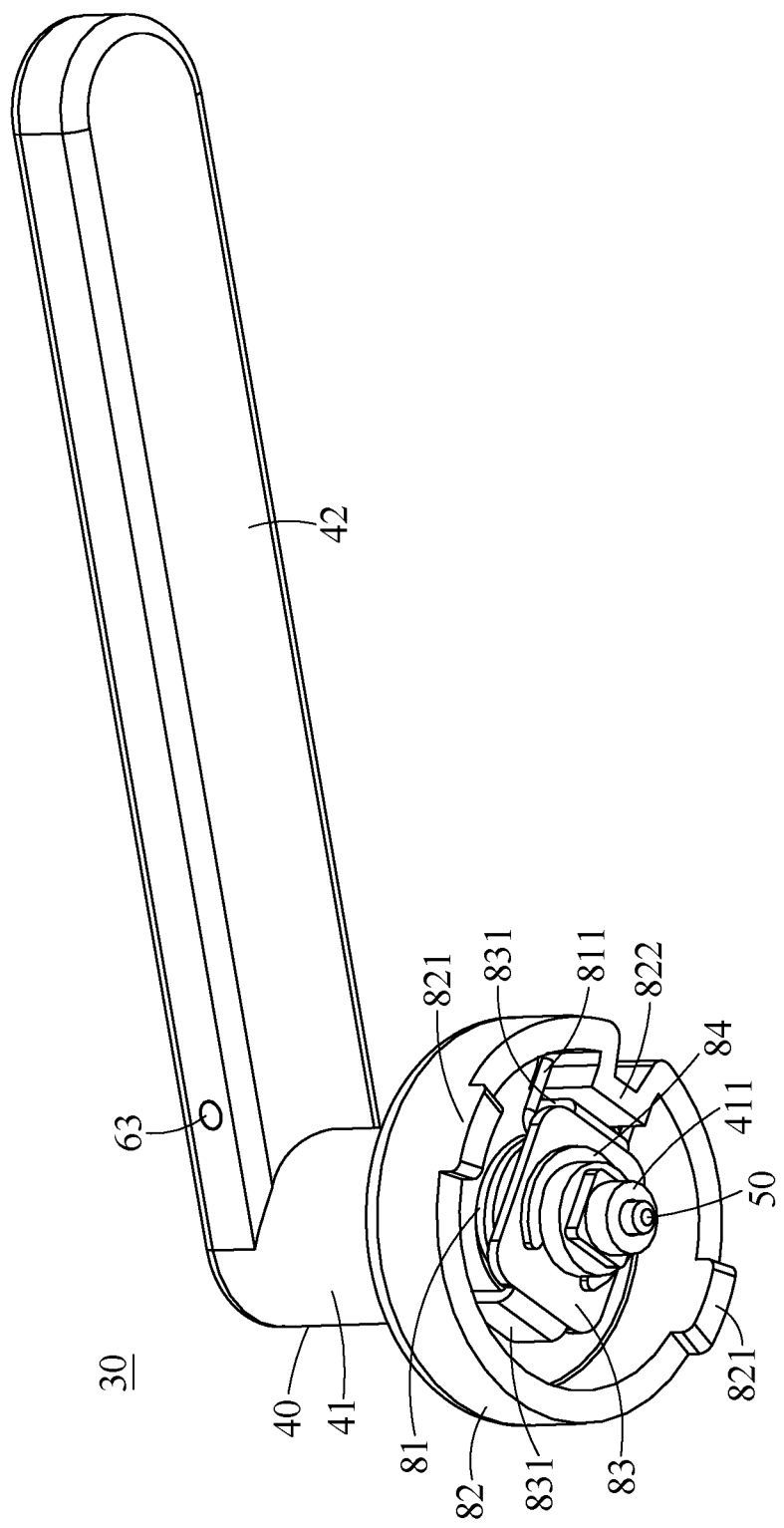
FIG. 11 illustrates a partial perspective view of the second circuit board shown in FIG. 4 from another view, showing a connectional relationship between an operating portion and a restoring element of a locking assembly, wherein a board body, a propulsion element, and a fasten element are not shown.

Please refer to FIG. 4 and FIG. 11. FIG. 11 illustrates a partial perspective view of the second circuit board shown in FIG. 4 from another view, showing a connectional relationship between an operating portion and a restoring element of a locking assembly, wherein a board body, a propulsion element, and a fasten element are not shown. As discussed above, the shaft 41 is provided to be rotated by taking the locking rod 50 or the Y axis of FIG. 4 as the rotational axis, so that the operating portion 40 is rotatable and connected to the board body 24. During operation, the operator can hold and rotate the handle 42.

Please refer to FIG. 4. In some embodiments, the locking assembly 30 further comprises an upper cap 82 and a lower cap 83. The first end portion 411 of the shaft 41 passes through the upper cap 82 and the lower cap 83 sequentially. The upper cap 82 has a locating portion 821 corresponding to a positioning hole 28 on the board body 24. The locating portion 821 is fixed on the positioning hole 28 of the board body 24, so that the upper cap 82 is not rotated upon the handle 42 is rotated. A square hole of the lower cap 83 is fitted over a corresponding square section of the shaft 41, so that the lower cap 83 is rotated upon the handle 42 is rotated.

Please refer to FIG. 4 and FIG. 11 together. In some embodiments, the upper cap 82 further has a restoring convex 822, and the lower cap 83 has a flange 831. The restoring convex 822 of the upper cap 82 corresponds to the flange 831 of the lower cap 83 (shown in FIG. 11). In FIG. 4, the locking assembly 30 further comprises a restoring element 81. The first end portion 411 of the shaft 41 passes through the restoring element 81, and the restoring element 81 is between the upper cap 82 and the lower cap 83. In this embodiment, the restoring element 81 may be a torsional spring, and two ends 811 of the torsional spring are respectively at two sides of the restoring convex 822 and the flange 831 (shown in FIG. 11). Therefore, when the operator rotates the handle 42, the lower cap 83 and the flange 831 are driven to rotate synchronously. Hence, the flange 831 of the lower cap 83 will abut against one of the two ends 811 of the torsional spring (the other end 811 of the torsional spring will abut against the restoring convex 822), so that the torsional spring starts to store an elastic energy due to the deformation. On the other hand, when the operator releases the handle 42, the torsional spring will push the shaft 41 and make the handle 42 rotate in a direction opposite to the direction as the operator rotates the handle 42. The rotation of the handle 42 will proceed till the flange 831 of the lower cap 83 is returned to the position corresponding to the restoring convex 822 of the upper cap 82. Besides, in FIG. 4, in some embodiments, the first end portion 411 of the shaft 41 passes through the upper cap 82, the restoring element 81, the lower cap 83, the fixed element 84, and the pivot hole 27 of the board body 24 sequentially. Therefore, the positions of the upper cap 82, the restoring element 81, and the lower cap 83 are fixed on the shaft 41 through the fixed element 84, and a restoring force of the restoring element 81 can be effectively applied on the shaft 41 and the board body 24.

Figure 12:
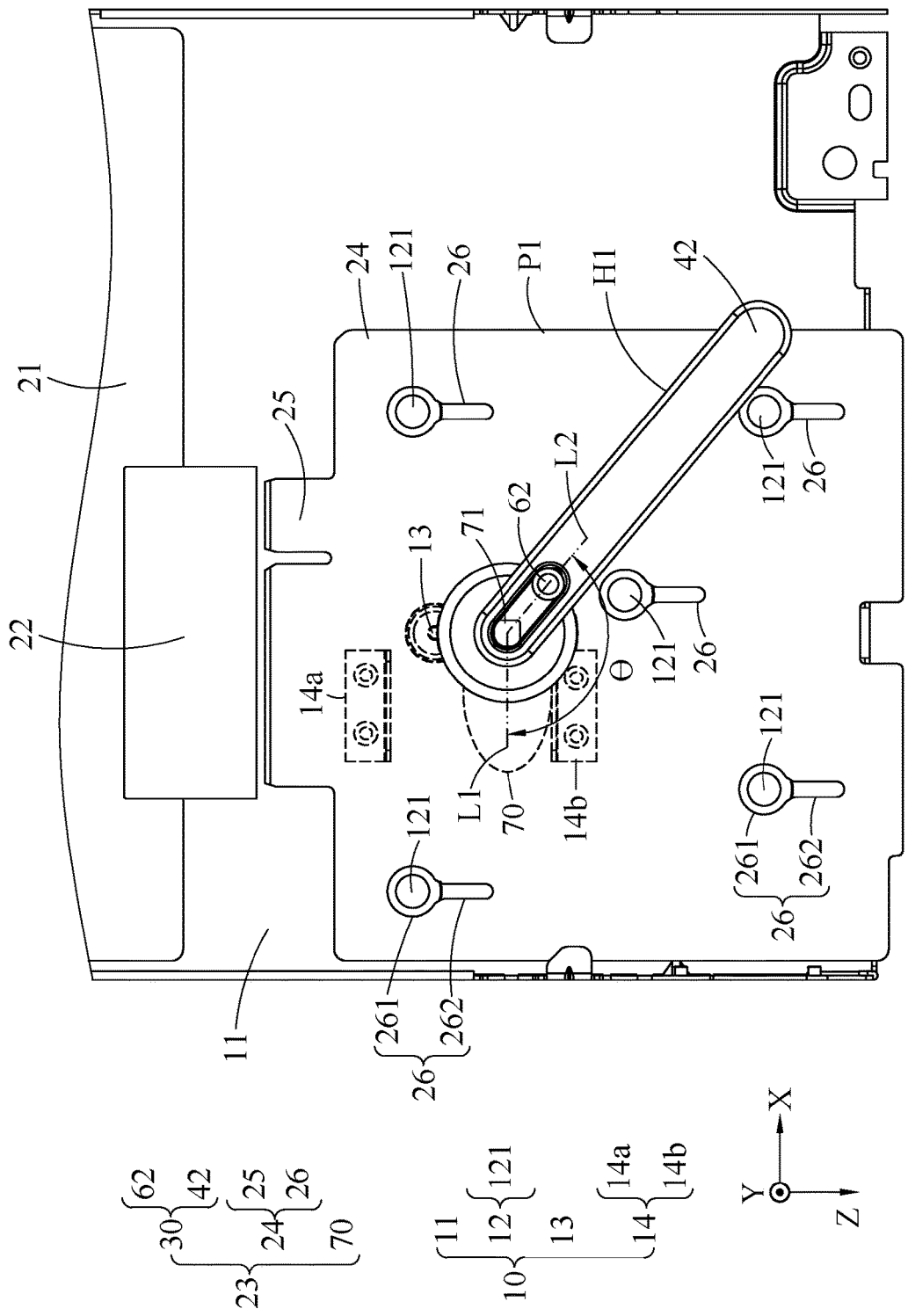
FIG. 12 illustrates a partial top view (1) of an electronic device according to some embodiments, showing a board body at a first board position and a handle at a first handle position.
Figure 13:
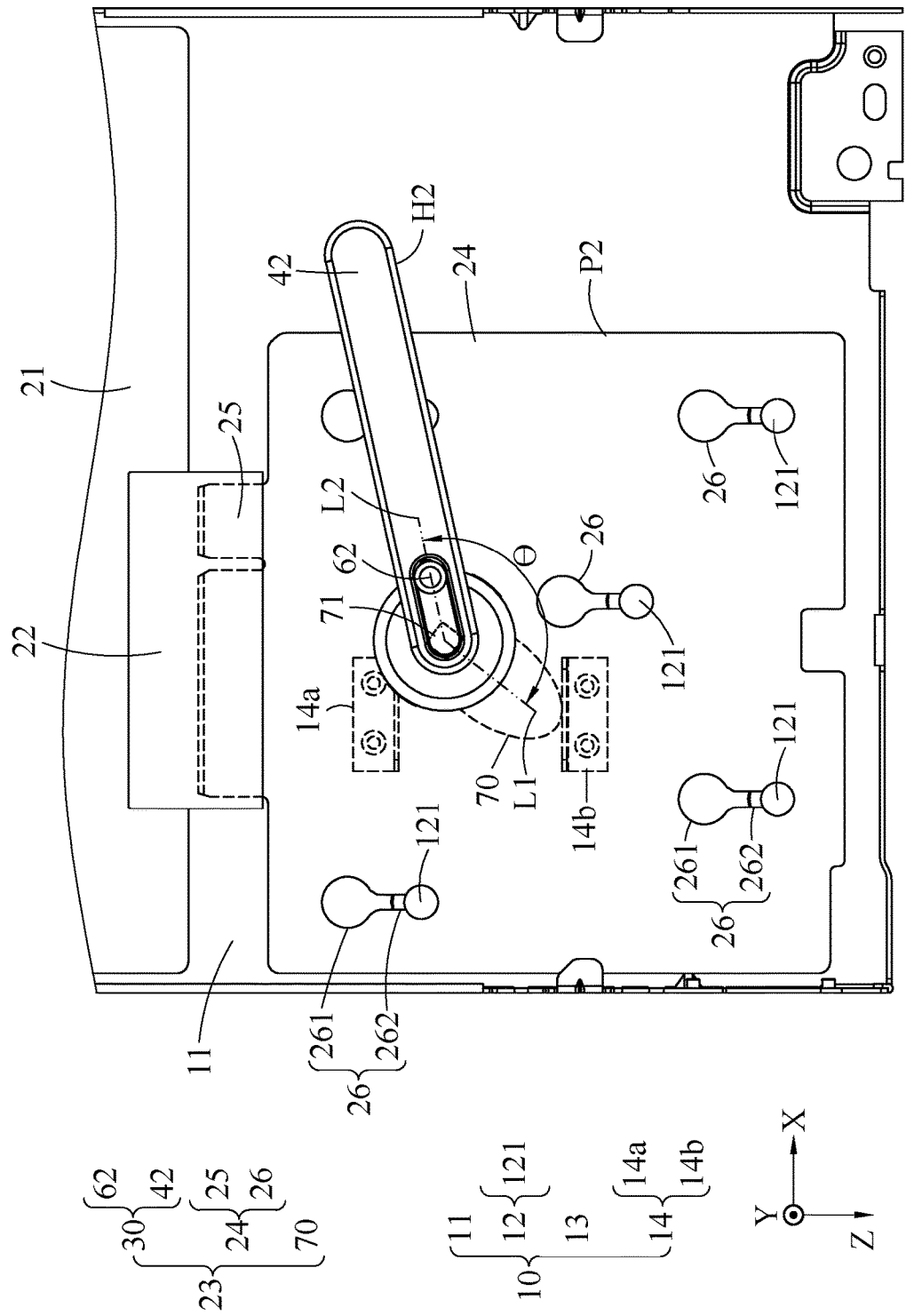
FIG. 13 illustrates a partial top view (2) of an electronic device according to some embodiments, showing a board body at a second board position and a handle at a second handle position.

Further, please refer to FIG. 12 and FIG. 13. FIG. 12 illustrates a partial top view (1) of an electronic device according to some embodiments, showing a board body at a first board position and a handle at a first handle position. FIG. 13 illustrates a partial top view (2) of an electronic device according to some embodiments, showing a board body at a second board position and a handle at a second handle position.

In some embodiments, the operator can hold and rotate the handle 42, and the handle 42 is rotatable between the first handle position H1 (such as the position of the handle 42 shown in FIG. 12) and the second handle position H2 (such as the position of the handle 42 shown in FIG. 13). The first handle position H1 and the second handle position H2 are two different positions of the handle 42 relative to the board body 24. In some embodiments, the first handle H1 may be the position of the handle 42 in the normal condition (such as the position of the handle 42 shown in FIG. 11, where the flange 831 of the lower cap 83 is at the position corresponding to the restoring convex 822 of the upper cap 82). The second handle position H2 is a position other than the first handle position H1 (for example, the second handle position H2 is the position of the handle 42 where the flange 831 of the lower cap 83 is not at the position corresponding to the restoring convex 822 of the upper cap 82, and in such configuration, the restoring element 81 has an ability to provide the force to push the shaft 41 and to rotate the handle 42 toward the first handle position H1). In some embodiments, the handle 42 in the normal condition may be a position where the handle 42 is not applied with an operating force by the operator.

Please refer to FIG. 12 and FIG. 13. In some embodiments, the chassis 10 further comprises an auxiliary element 14 fixed on the bottom plate 11. The second circuit board 23 further comprises a propulsion element 70. Please refer to FIG. 4, FIG. 12, and FIG. 13 together. The first end portion 411 of the shaft 41 passes through the pivot hole 27 of the board body 24 and the propulsion element 70. The fasten element 90 fastens the first end portion 411 of the shaft 41, so that the propulsion element 70 is located between the board body 24 and the fasten element 90. In some embodiments, the propulsion element 70 has a mounting hole 71. The shape of the mounting hole 71 corresponds to the cross section of a corresponding position of the first end portion 411 of the shaft 41, so that the propulsion element 70 is not rotatable relative to the shaft 41. Specifically, in this embodiment, the first end portion 411 of the shaft 41 passes through the pivot hole 27 of the board body 24 and the propulsion element 70 sequentially. There is an angle θ is between the handle 42 and the propulsion element 70. In other words, in this embodiment, the angle θ is between the imaginary lines L2 and L1, wherein the imaginary line L2 is the center line of the handle 42 projecting on the plane where the propulsion element is located, and the imaginary line L1 is the line passing through the mounting hole 71 of the propulsion element 70. The degree of the angle θ is not changeable upon the handle 42 is rotated, and the connection between the shaft 41 and the propulsion element 70 is a fixed connection configuration. For example, as shown FIG. 12, when the shaft 41 is rotated by taking the Y axis as the rotation axis, the propulsion element 70 is driven to rotate synchronously. Because the shaft 41 is not rotatable relative to the propulsion element 70, when the handle 42 is rotated to the position shown in FIG. 13, the degree of the angle θ is not changed. In some embodiments, the propulsion element 70 may be a cam, and the mounting hole 71 is at an eccentric position of the cam.

Figure 14:
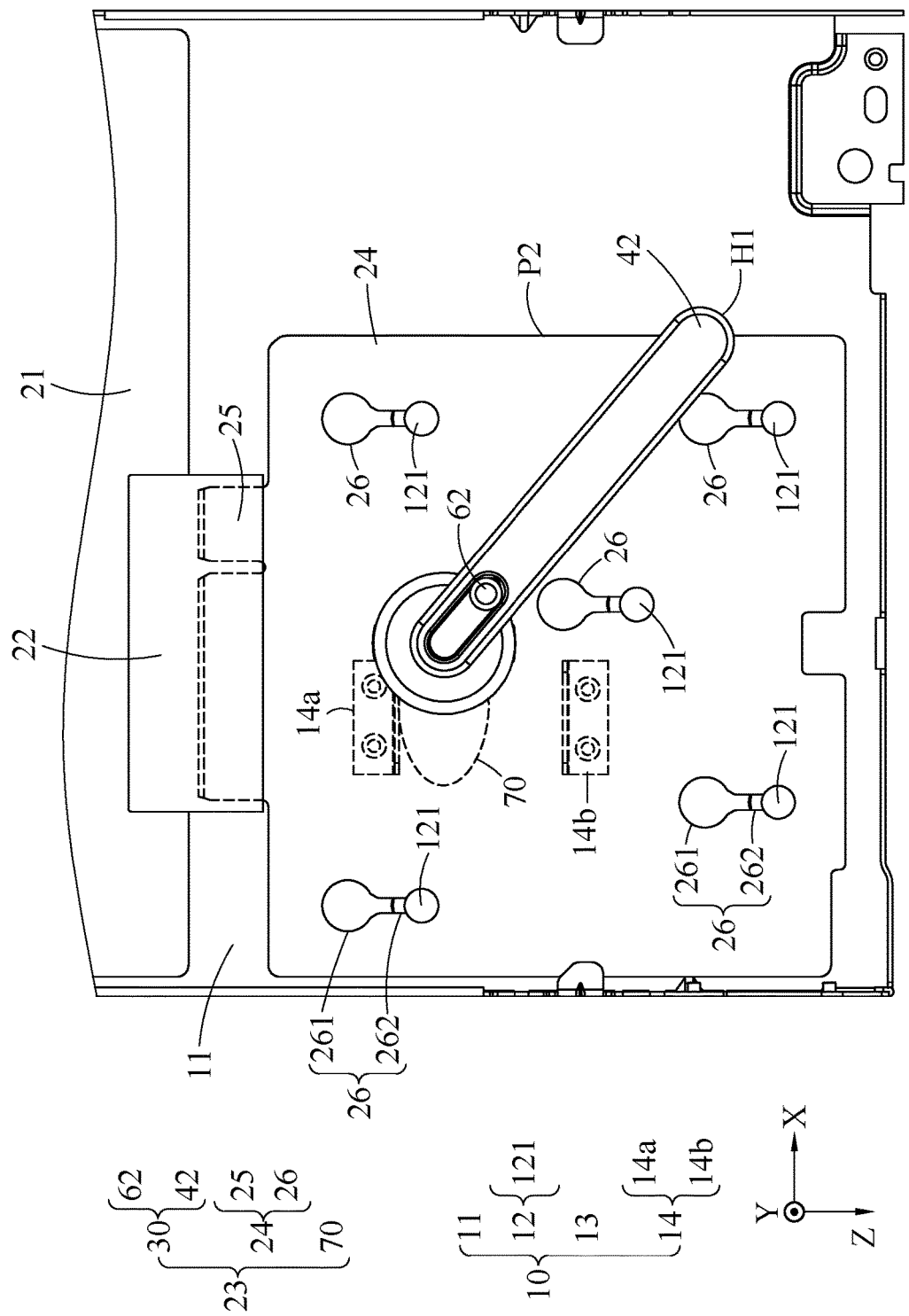
FIG. 14 illustrates a partial top view (3) of an electronic device according to some embodiments, showing a board body at a second board position and a handle at a first handle position.

Please refer to FIG. 12, FIG. 13 and FIG. 14. FIG. 14 illustrates a partial top view (3) of an electronic device according to some embodiments, showing a board body at a second board position and a handle at a first handle position.

Please refer to FIG. 1, FIG. 12, FIG. 13 and FIG. 14 sequentially. In FIG. 1, during the assembling process, the operator aims the insertion section 261 of the matching portion 26 of the second circuit board 23 at the guiding portion 12 of the bottom plate 11 and pushes the second circuit board 23 downward in the −Y axis direction. Hence, the head 121 of the guiding portion 12 passes through the insertion section 261, as shown in FIG. 12. At this moment, the locking end 51 of the locking rod 50 is not at the position corresponding to the locating hole 13 of the bottom plate 11 (that is, in this embodiment, the locking end 51 of the locking rod 50 abuts against the surface of the bottom plate 11, and the propulsion element 70 (cam) contacts the stopping element 14b). Then, in FIG. 12, the operator pushes the second circuit board 23 in the −Z axis direction, so that the guiding element 12 is pushed into the rail section 262 of the matching portion 26. At this moment, the handle 42 is not rotated relative to the board body 24 yet. Therefore, the handle 42 is maintained at the first handle position H1 by the restoring element 81. Next, the operator rotates the handle 42 counterclockwise from the viewing angle of FIG. 12 and pushes the handle 42 in the −Z axis direction. The rotation of the handle 42 will drive the shaft 41 and the propulsion element 70 (cam) to rotate synchronously. Based on the guidance of the guiding element 12 on the rail section 262 of the matching portion 26 plus the abutting of the propulsion element 70 (cam) against the stopping element 14b, the board body 24 is slid in the −Z axis direction. Therefore, the second connector 25 is connected to the first connector 22, as shown in FIG. 13 (in other words, in this embodiment, the board body 24 is at the second board position P2, and the handle 42 is at the second handle position H2). After that, the operator releases the handle 42, so that the restoring element 81 will push the shaft 41 to drive the handle 42 back to the first handle position H1, and the propulsion element 70 (cam) is also driven to synchronously rotate to a position abutting against the stopping element 14*a*, as shown in FIG. 14.

Figure 15:
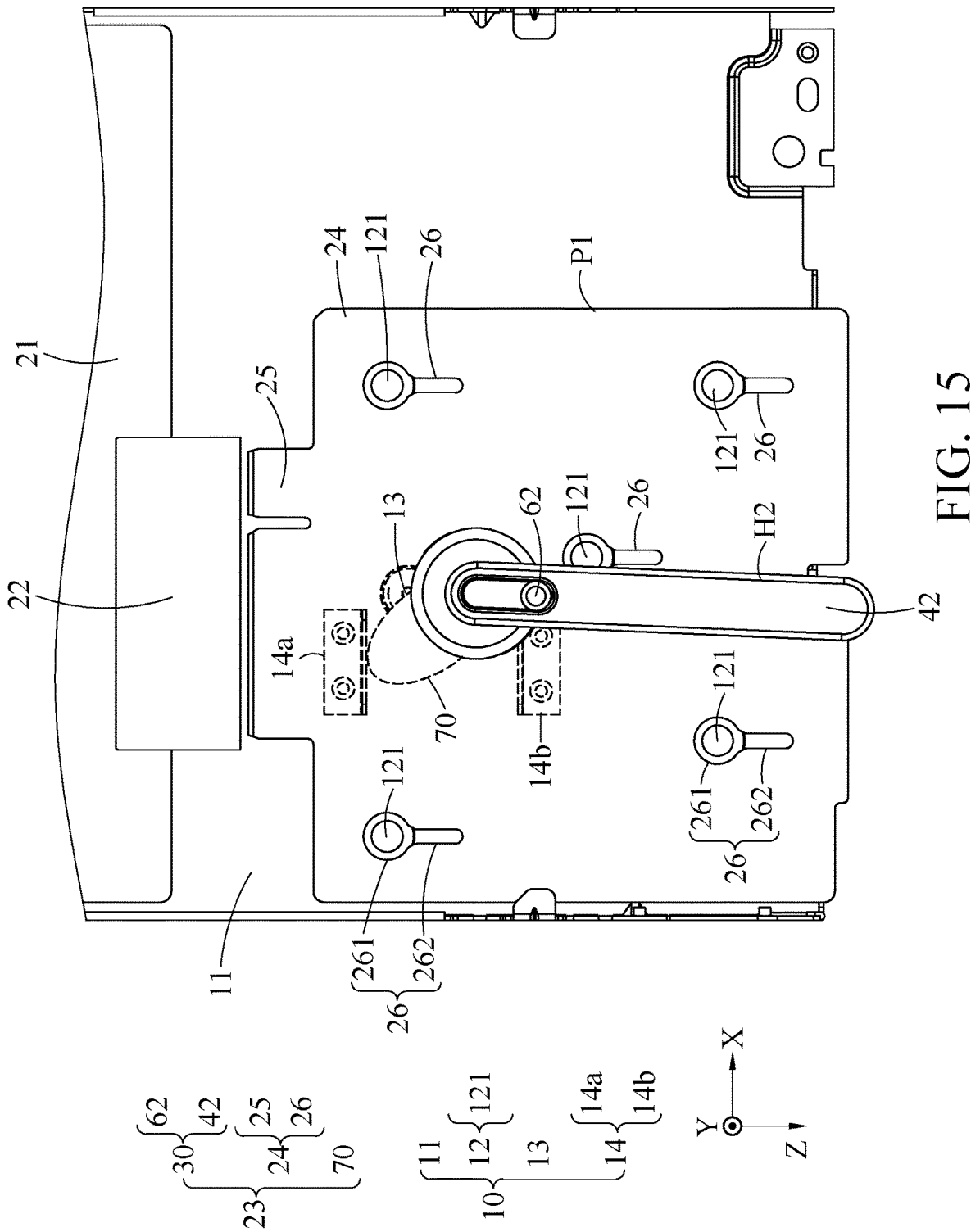
FIG. 15 illustrates a partial top view (4) of an electronic device according to some embodiments, showing a board body at a first board position and a handle at a second handle position.

On the other hand, please refer to FIG. 14 and FIG. 15. FIG. 15 illustrates a partial top view (4) of an electronic device according to some embodiments, showing a board body at a first board position and a handle at a second handle position.

In some embodiments, when the handle 42 is pivotally rotated from the first handle position H1 to the second handle position H2, the board body 24 is slid from the second board position P2 to the first board position P1 through a cooperative driving of the propulsion element 70 and the auxiliary element 14. The cooperative driving may be a movement caused by the abutting of the propulsion element 70 against the auxiliary element 14 so as to provide a propulsion force to push the board body 24 to slide. The propulsion element 70 may be a cam or a gear wheel, and the auxiliary element 14 may be stopping elements 14*a* and 14*b* corresponding to the cam or a gear rack 14*c* corresponding to the gear wheel (details of the embodiment of the gear wheel as the propulsion element 70 and the gear rack 14*c* as the auxiliary element 14 are described later). As far as the inventor knows, when the operator would like to detach the circuit board from the connector, a greater plugging force, such as a force exceeding 6 kilogram-force (kgf), is needed, which is inconvenient for operation. Therefore, in this embodiment, the abutting of the propulsion element 70 against the auxiliary element 14 can help the operator applying a proper operating force on the handle 42 when detaching off the circuit board, which is labor-saving. Besides, the wearing of the components can be reduced during assembling or disassembling the circuit board.

In FIG. 14, when the operator would like to detach off the circuit board, the operator presses the pressing element 62 to detach the locking rod 50 from the locked position D1. At this moment, the handle 42 has been not rotated relative to the board body 24 yet. The propulsion element 70 (cam) contacts the stopping element 14*a*, and the handle 42 is maintained at the first handle position H1 by the restoring element 81. Next, the operator rotates the handle 42 clockwise from the viewing angle of FIG. 14 and pulls the handle 42 in the +Z axis direction. The rotation of the handle 42 will drive the shaft 41 and the propulsion element 70 (cam) to rotate synchronously. Based on the fixed connection configuration of the stopping elements 14*a* and 14*b* on the bottom plate 11, the guidance of the guiding element 12 on the matching portion 26, and the abutting of the propulsion element 70 (cam) against the stopping element 14*a*, the board body 24 is pushed to slide in the +Z axis direction, as shown in FIG. 15. Thus, the operator can detach the second connector 25 from the first connector 22 with less effort. After that, the operator releases the handle 42. The restoring element 81 will push the shaft 41 to drive the handle 42 back to the first handle position H1, and the propulsion element 70 (cam) is also driven to rotate synchronously, as shown in FIG. 12. At the moment, the head 121 of the guiding portion 12 is at the insertion section 261 of the matching portion 26, and the operator is able to pull the second circuit board 23 in the +Y axis direction. Moreover, in the embodiment shown in FIG. 13 and FIG. 15, since the operator can rotate the handle 42 in different directions, the second handle position H2 of the handle 42 relative to the board body 24 in FIG. 15 may be different from the second handle position H2 of the handle 42 relative to the board body 24 in FIG. 13.

Figure 16:
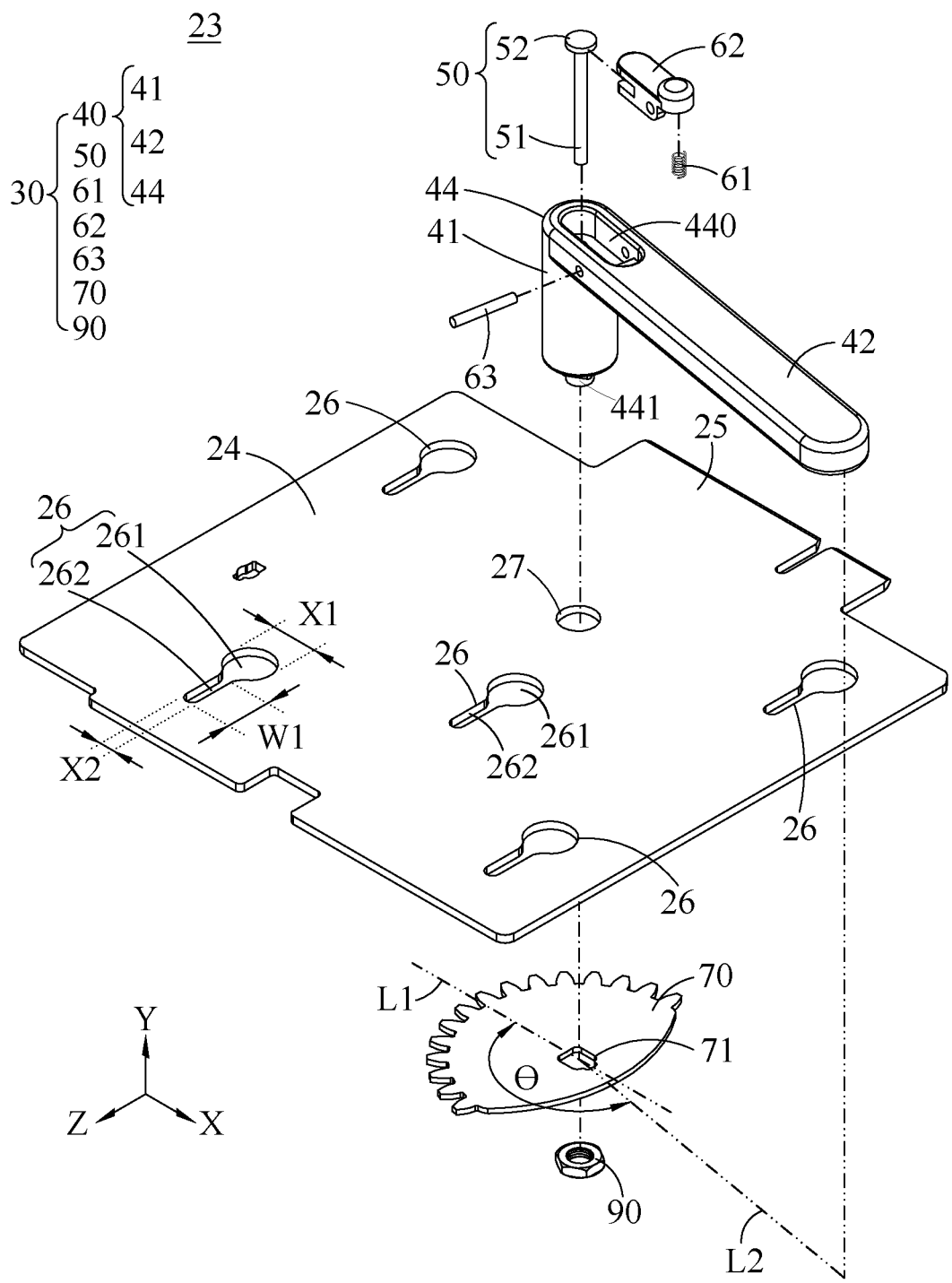
FIG. 16 illustrates an exploded view (2) of a second circuit board according to some embodiments.
Figure 17:
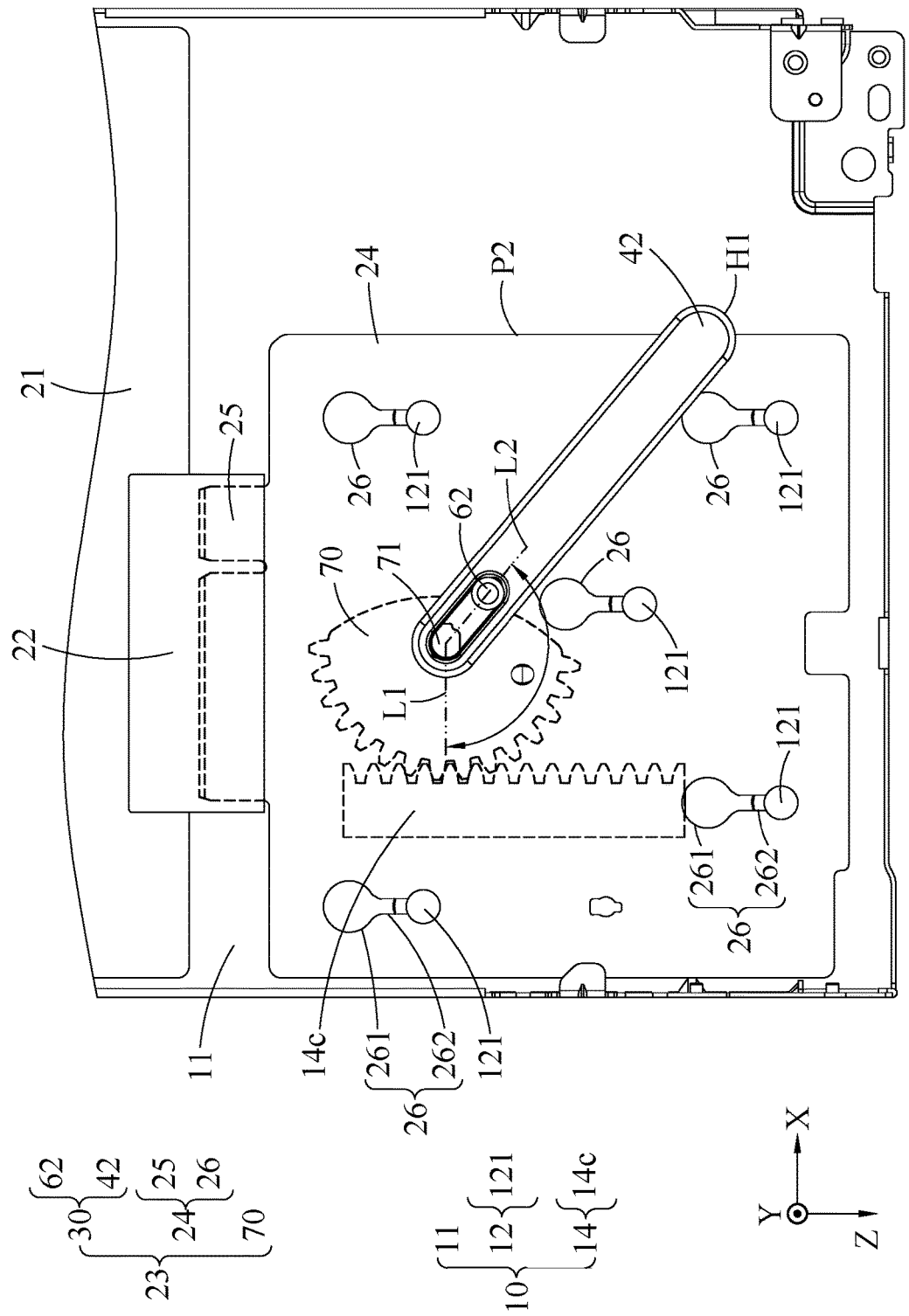
FIG. 17 illustrates a partial top view (5) of an electronic device according to some embodiments, showing a board body at a second board position and a handle at a first handle position.
Figure 18:
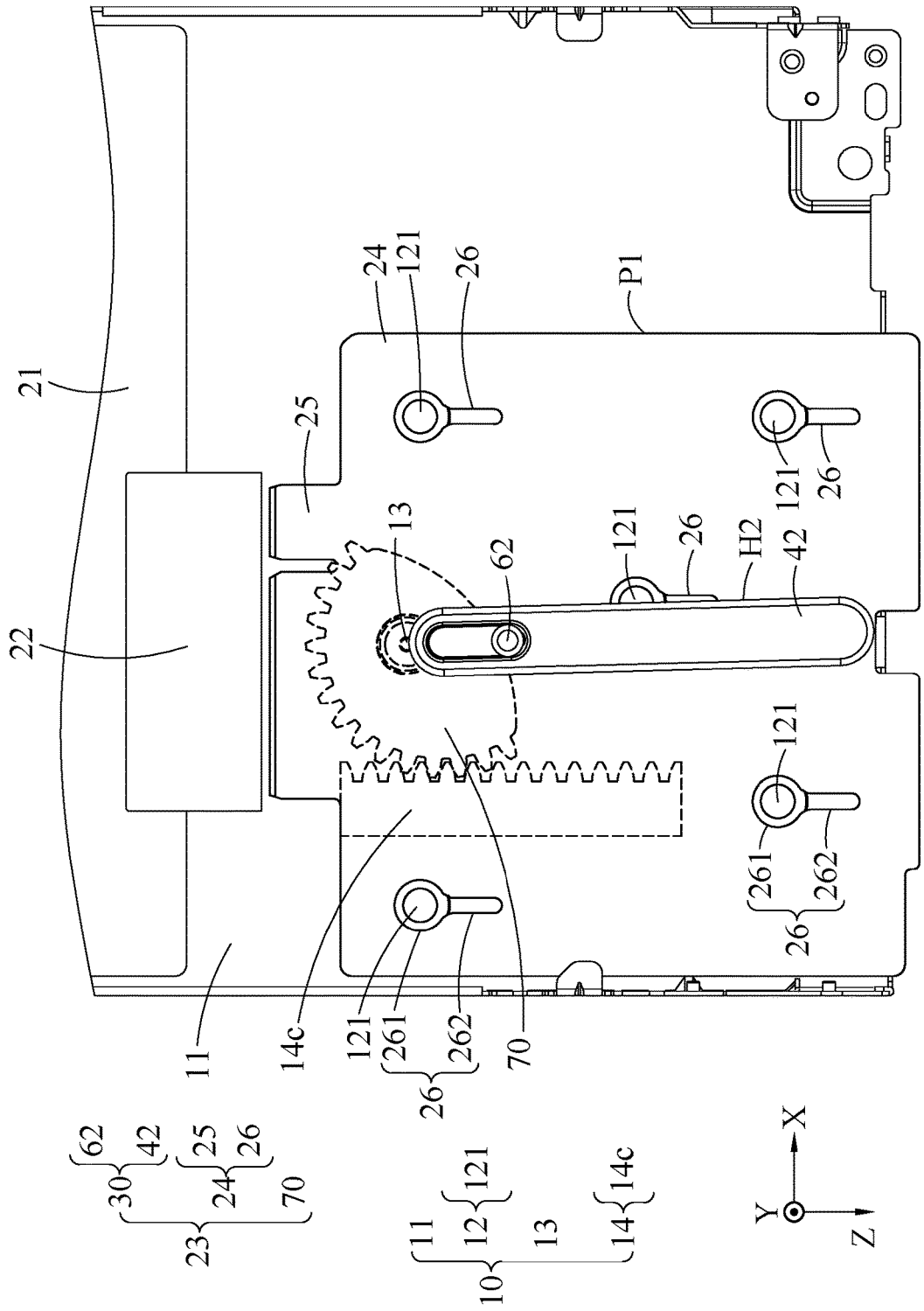
FIG. 18 illustrates a partial top view (6) of an electronic device according to some embodiments, showing a board body at a first board position and a handle at a second handle position.

Further, another embodiment of the abutting of the propulsion element 70 against the auxiliary element 14 may be an engagement of the gear wheel and the gear rack 14*c*. Please refer to FIG. 16, FIG. 17, and FIG. 18. FIG. 16 illustrates an exploded view (2) of a second circuit board according to some embodiments. FIG. 17 illustrates a partial top view (5) of an electronic device according to some embodiments, showing a board body at a second board position and a handle at a first handle position. FIG. 18 illustrates a partial top view (6) of an electronic device according to some embodiments, showing a board body at a first board position and a handle at a second handle position.

In the embodiments shown in FIG. 16, FIG. 17, and FIG. 18, the propulsion element 70 may be the gear wheel. In FIG. 17 and FIG. 18, the auxiliary element 14 may be the gear rack 14*c* corresponding to the gear wheel and fixed on the bottom plate 11. In FIG. 16, the first end portion 411 of the shaft 41 passes through the pivot hole 27 of the board body 24 and the mounting hole 71 of the gear wheel. The fasten element 90 fastens the first end portion 411 of the shaft 41, so that the propulsion element 70 is located between the board body 24 and the fasten element 90. As described above, the connection of the shaft 41 and the propulsion element 70 is a fixed connection configuration. In other words, in this embodiment, the angle θ is between the imaginary lines L2 and L1, wherein the imaginary line L2 is the center line of the handle 42 projecting on the plane where the propulsion element 70 is located, and the imaginary line L1 is the line passing through the mounting hole 71 of the propulsion element 70. The degree of the angle θ is not changeable upon the handle 42 is rotated.

In FIG. 17 and FIG. 18, the propulsion element 70 (gear wheel) is engaged with the gear rack 14*c*. When the operator would like to detach the second circuit board 23 from the chassis 10 (namely, in this embodiment, the second circuit board 23 is driven to slide from the position shown in FIG. 17 toward the position shown in FIG. 18), the operator first presses the pressing element 62 to detach the locking rod 50 from the locked position D1, and then the operator can hold and rotate the handle 42 clockwise from the viewing angle of FIG. 17. The rotation of the handle 42 will drive the shaft 41 and the propulsion element 70 (cam) to rotate synchronously. Based on the fixed connection configuration of the gear rack 14*c* on the bottom plate 11, the engagement between the propulsion element 70 (gear wheel) and the gear rack 14*c*, the fixed connection configuration of the shaft 41 and the propulsion element 70, and the guidance of the guiding element 12 on the matching portion 26, the second circuit board 23 (the board body 24) is able to be slid in the +Z axis direction. As a result, the second circuit board 23 is not connected to the first circuit board 21. Under such configuration, the second circuit board 23 is at the first board position P1 and the handle 42 is at the second handle position H2, as shown in FIG. 18.

On the other hand, when the operator would like to insert the circuit board into the connector (namely, in this embodiment, the second circuit board 23 is driven to slide from the position shown in FIG. 18 toward the position shown in FIG. 17), the abutting of the propulsion element 70 (gear wheel) against the gear rack 14*c* can help the board body 24 sliding in the −Z axis direction. In FIG. 18, the operator holds and rotates the handle 42 counterclockwise from the viewing angle of FIG. 18. The rotation of the handle 42 will drive the shaft 41 and the propulsion element 70 (gear wheel) to rotate synchronously. Based on the engagement between the propulsion element 70 (gear wheel) and the gear rack 14c, and the guidance of the guiding element 12 on the matching portion 26, the board body 24 is slid to the position shown in FIG. 17. That is, in this embodiment, the first circuit board 21 is thus connected to the second circuit board 23. Under such configuration, the second circuit board 23 is at the second board position P2, and the handle 42 is at the first handle position H1.

As shown in FIG. 17 and FIG. 18, in some embodiments, the first handle position H1 is the position where the handle 42 is maintained when the second circuit board 23 at the second board position P2. The second handle position H2 is the position where the handle 42 is maintained when the second circuit board 23 at the first board position P1.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An electronic device, comprising:
    a chassis comprising a bottom plate and a locating hole on the bottom plate;
    a board body; and
    a locking assembly, comprising:
        an operating portion connected to the board body; and
        a locking rod being slidably along the operating portion between a locked position and a released position, wherein a locking end of the locking rod is in the locating hole when the locking rod is at the locked position.

2. The electronic device according to claim 1, wherein the locking assembly further comprises an elastic element; and the elastic element provides a force on the locking rod to push the locking rod toward the locked position.

3. The electronic device according to claim 2, wherein the locking assembly further comprises a pressing element; the pressing element is pivotally connected to the operating portion and comprises a first arm and a second arm; the locking end of the locking rod is toward the board body; an abutting end and the locking end are at opposite ends of the locking rod; the elastic element abuts against the first arm; the second arm contacts the abutting end of the locking rod; and the elastic element provides the force on the locking rod to push the locking rod toward the locked position.

4. The electronic device according to claim 1, wherein the board body has a pivot hole; the operating portion comprises a shaft, a handle, and a connection portion; the connection portion is at a joint portion between the shaft and the handle; the shaft has a first end portion, a second end portion, and a through hole; the second end portion is connected to the handle;
    the first end portion of the shaft is pivotally connected to the pivot hole; the handle is rotatably between a first handle position and a second handle position; two openings of the through hole of the shaft are at the first end portion and the second end portion, respectively; and the locating rod is slidably along the through hole.

5. The electronic device according to claim 4, wherein the locking assembly further comprises a restoring element; two ends of the restoring element push the board body and the shaft, respectively; and the restoring element provides a restoring force to push the handle to rotate toward the first handle position.

6. The electronic device according to claim 5, wherein the locking assembly further comprises an upper cap and a lower cap; the upper cap is fixed to the board body;
    the lower cap is fixed to the shaft; and the two ends of the restoring element abut against the upper cap and the lower cap, respectively.

7. The electronic device according to claim 4, further comprising a circuit board and a propulsion element, wherein
    the circuit board is fixed to the bottom plate and comprises a first connector; the chassis further comprises a guiding portion and an auxiliary element; the guiding portion and the auxiliary element are disposed on the bottom plate; the board body comprises a matching portion and a second connector; the matching portion is slidably along the guiding portion; the board body is slidably between a first board position and a second board position; and the second connector is connected to the first connector when the board body is at the second board position;
    the first end portion of the shaft passes through the pivot hole and is fixed to the propulsion element; when the handle is pivotally rotated from the first handle position to the second handle position, the board body is slid from the second board position to the first board position through a cooperative driving of the propulsion element and the auxiliary element.

8. The electronic device according to claim 7, wherein the propulsion element is a cam, and the auxiliary element comprises two stopping elements; when the handle is pivotally rotated from the first handle position to the second handle position, the cam abuts against one of the two stopping elements, and the board body is slid from the second board position to the first board position.

9. The electronic device according to claim 7, wherein the propulsion element is a gear wheel, the auxiliary element is a gear rack; the gear wheel is engaged with the gear rack; when the handle is pivotally rotated from the first handle position to the second handle position, through a propulsion of the gear wheel and the gear rack, the board body is slid from the second board position to the first board position.

10. The electronic device according to claim 1, wherein the bottom plate has a slope portion on one side of the locating hole.

11. A circuit board having a locking structure, comprising:
    a board body;
    a locking assembly comprising:
        an operating portion comprising a shaft, wherein the shaft has a first end portion and a through hole, and the first end portion is connected to the board body; and
        a locking rod being slidably along the through hole between a locked position and a released position; and
    a pressing element, swingably pivoted to the operating portion.

12. The circuit board having the locking structure according to claim 11, wherein the locking assembly further comprises an elastic element; and the elastic element provides a force on the locking rod to push the locking rod toward the locked position.

13. The circuit board having the locking structure according to claim 12, wherein the pressing element comprises a first arm and a second arm; a locking end of the locking rod is toward the board body; an abutting end and the locking end are at opposite ends of the locking rod; the elastic element abuts against the first arm; the second arm contacts the abutting end of the locking rod; and the elastic element provides the force on the locking rod to push the locking rod toward the locked position.

14. The circuit board having the locking structure according to claim 13, wherein the pressing element further comprises a docking portion; the abutting end of the locking rod is between the docking portion and the second arm; and the abutting end of the locking rod contacts the docking portion.

15. The circuit board having the locking structure according to claim 11, wherein the operating portion further comprises a handle; the shaft has a second end portion; the second end portion is connected to the handle; and two openings of the through hole of the shaft are at the first end portion and the second end portion, respectively.

16. The circuit board having the locking structure according to claim 15, wherein the board body comprises a pivot hole; the operating portion further comprises a connection portion; the connection portion is at a joint portion between the shaft and the handle; the first end portion of the shaft is pivotally connected to the pivot hole; and the handle is rotatably between a first handle position and a second handle position.

17. The circuit board having the locking structure according to claim 16, wherein the locking assembly further comprises a restoring element; two ends of the restoring element push the board body and the shaft, respectively; and the restoring element provides a restoring force to push the handle to rotate toward the first handle position.

18. The circuit board having the locking structure according to claim 17, wherein the locking assembly further comprises an upper cap and a lower cap; the upper cap is fixed to the board body; the lower cap is fixed to the shaft; and the two ends of the restoring element abut against the upper cap and the lower cap, respectively.

19. The circuit board having the locking structure according to claim 16, further comprising a propulsion element, wherein the first end of the shaft passes through the pivot hole and is fixed to the propulsion element.

20. The circuit board having the locking structure according to claim 19, wherein the propulsion element is a cam or a gear wheel.

* * * * *